(12) United States Patent
Van Dal et al.

(10) Patent No.: US 12,089,423 B2
(45) Date of Patent: *Sep. 10, 2024

(54) GATE ALL AROUND SEMICONDUCTOR STRUCTURE WITH DIFFUSION BREAK

(71) Applicant: Taiwan Semiconductor Manufacturing Co., Ltd., Hsinchu (TW)

(72) Inventors: Marcus Johannes Henricus Van Dal, Hsinchu (TW); Timothy Vasen, Hsinchu (TW); Gerben Doornbos, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/311,839

(22) Filed: May 3, 2023

(65) Prior Publication Data

US 2023/0301120 A1    Sep. 21, 2023

Related U.S. Application Data

(63) Continuation of application No. 17/680,199, filed on Feb. 24, 2022, now Pat. No. 11,653,507, which is a continuation of application No. 16/559,341, filed on Sep. 3, 2019, now Pat. No. 11,276,832.

(60) Provisional application No. 62/772,427, filed on Nov. 28, 2018.

(51) Int. Cl.
*H10K 10/46*   (2023.01)
*H10K 19/10*   (2023.01)
*H10K 85/20*   (2023.01)

(52) U.S. Cl.
CPC ......... *H10K 10/484* (2023.02); *H10K 10/491* (2023.02); *H10K 19/10* (2023.02); *H10K 85/221* (2023.02)

(58) Field of Classification Search
None
See application file for complete search history.

(56) References Cited

U.S. PATENT DOCUMENTS

| | | |
|---|---|---|
| 9,236,267 B2 | 1/2016 | De et al. |
| 9,502,265 B1 | 11/2016 | Jiang et al. |
| 9,520,466 B2 | 12/2016 | Holland et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,063 B2 | 3/2017 | Hashemi et al. |
| 9,608,116 B2 | 3/2017 | Ching et al. |
| 9,748,404 B1 * | 8/2017 | Chang ............... H01L 29/66439 |

(Continued)

*Primary Examiner* — Telly D Green
(74) *Attorney, Agent, or Firm* — Seed IP Law Group LLP

(57) ABSTRACT

The current disclosure describes techniques for forming semiconductor structures having multiple semiconductor strips configured as channel portions. In the semiconductor structures, diffusion break structures are formed after the gate structures are formed so that the structural integrity of the semiconductor strips adjacent to the diffusion break structures will not be compromised by a subsequent gate formation process. The diffusion break extends downward from an upper surface until all the semiconductor strips of the adjacent channel portions are truncated by the diffusion break.

20 Claims, 41 Drawing Sheets

(56) References Cited

U.S. PATENT DOCUMENTS

| | | | |
|---|---|---|---|
| 9,786,774 B2 | 10/2017 | Colinge et al. | |
| 9,853,101 B2 | 12/2017 | Peng et al. | |
| 9,881,993 B2 | 1/2018 | Ching et al. | |
| 10,446,669 B2 | 10/2019 | Fan et al. | |
| 11,031,298 B2 | 6/2021 | Liao et al. | |
| 11,276,832 B2* | 3/2022 | van Dal | H10K 10/491 |
| 11,653,507 B2* | 5/2023 | Van Dal | H10K 19/10 |
| | | | 257/40 |
| 2017/0140933 A1* | 5/2017 | Lee | H01L 29/1079 |
| 2018/0090624 A1* | 3/2018 | Cheng | H01L 29/78687 |
| 2018/0151452 A1* | 5/2018 | Doornbos | H01L 29/0673 |
| 2018/0315817 A1 | 11/2018 | Van Dal et al. | |
| 2019/0103317 A1* | 4/2019 | Yu | H01L 21/823412 |
| 2019/0131394 A1* | 5/2019 | Reznicek | H01L 21/30604 |
| 2019/0198520 A1 | 6/2019 | Kim et al. | |
| 2019/0393305 A1* | 12/2019 | Yeh | H01L 29/66439 |
| 2020/0006559 A1 | 1/2020 | Mehandru et al. | |
| 2020/0058792 A1 | 2/2020 | Song et al. | |
| 2020/0098858 A1 | 3/2020 | Yang et al. | |
| 2020/0161419 A1 | 5/2020 | Yang | |
| 2021/0057023 A1 | 2/2021 | Liaw | |

* cited by examiner

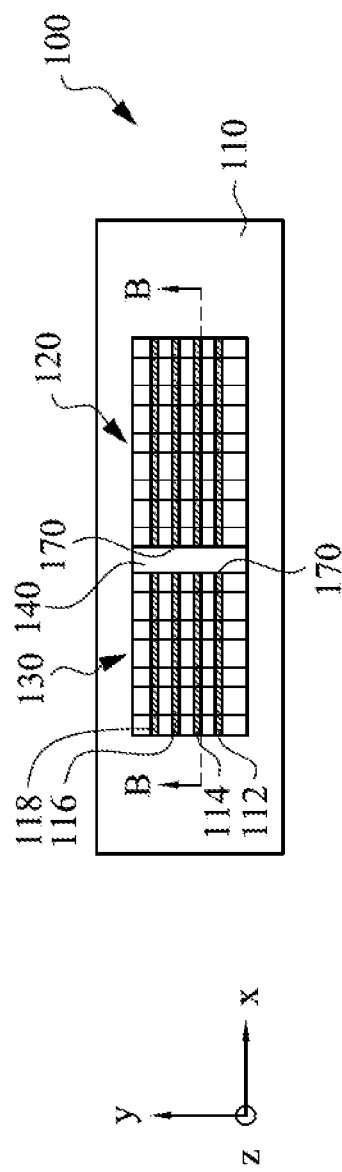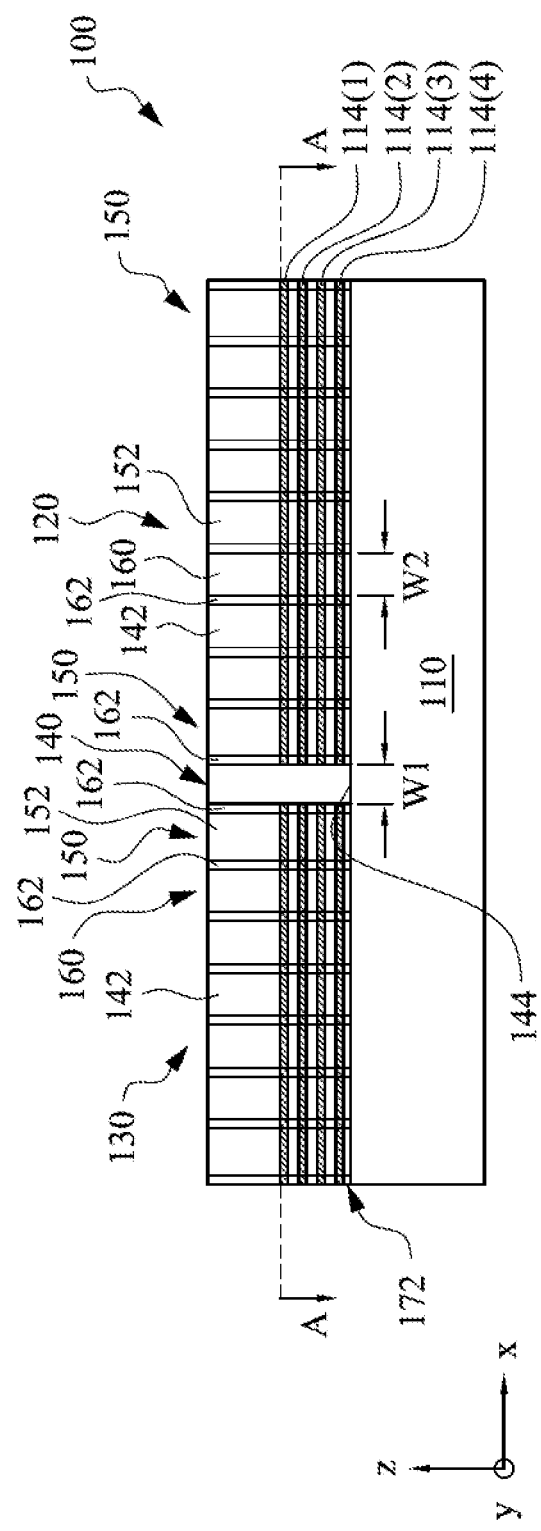
FIG. 1A
FIG. 1B

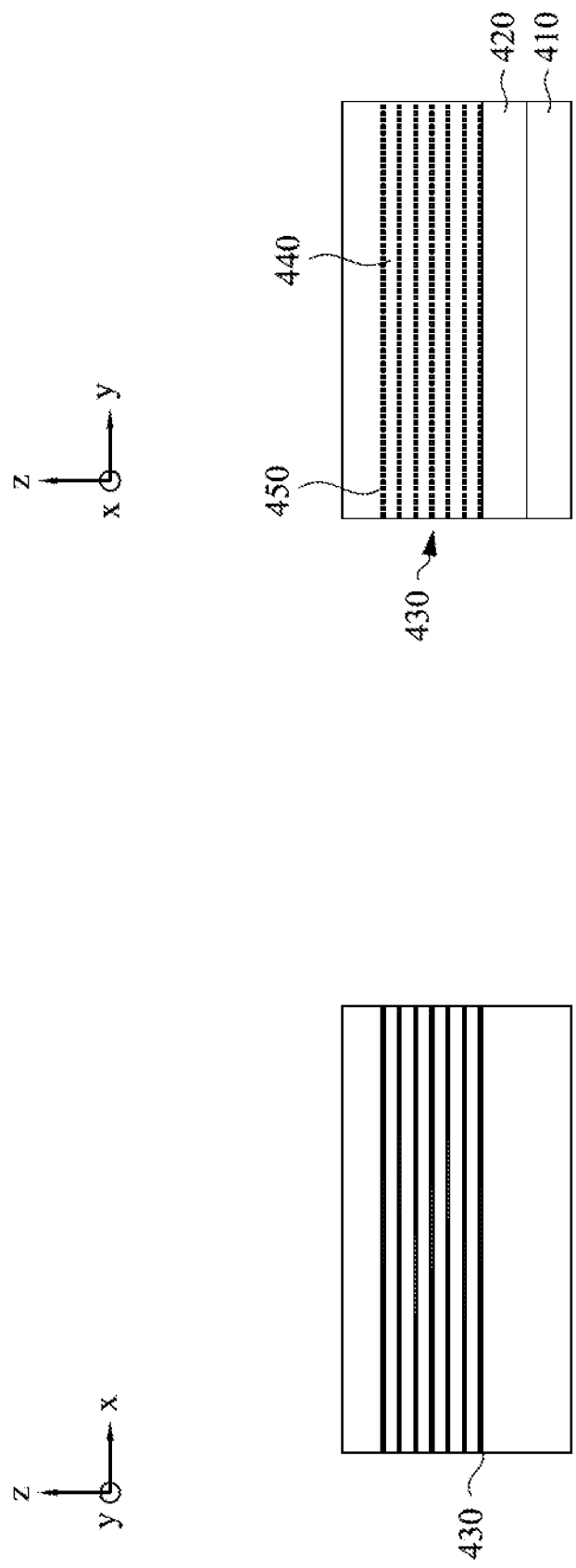

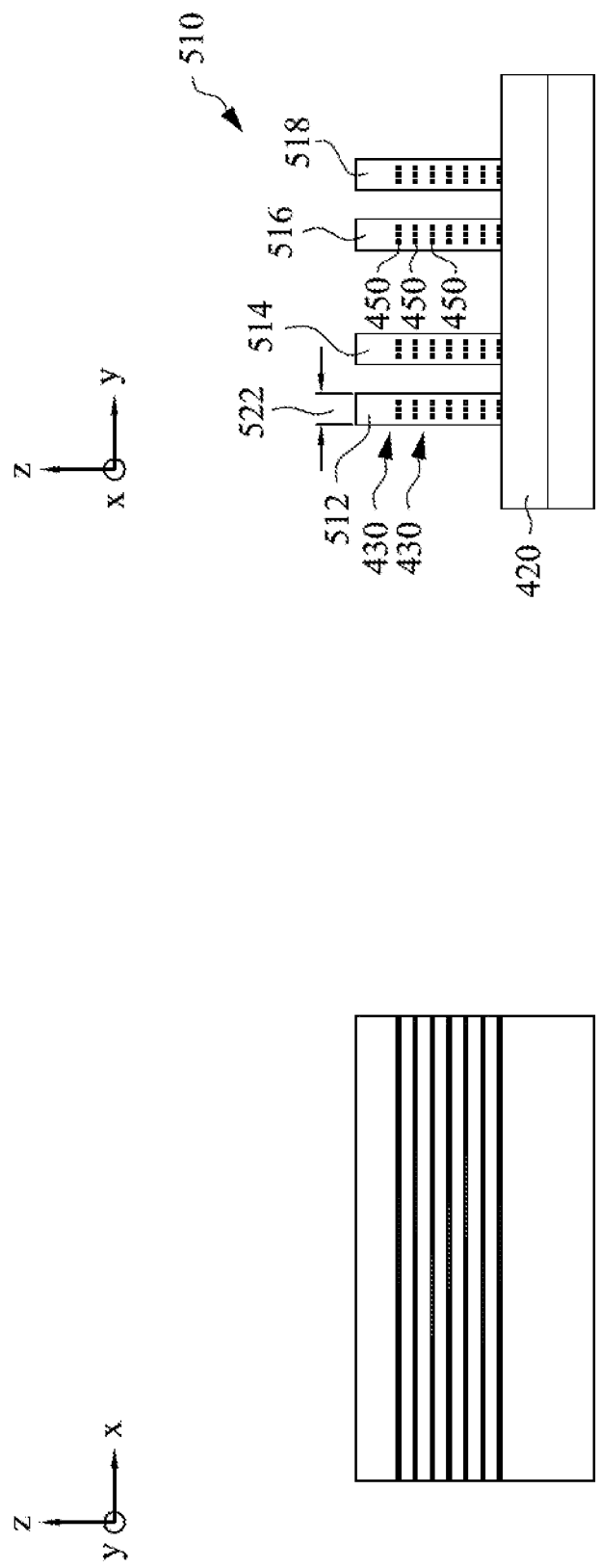

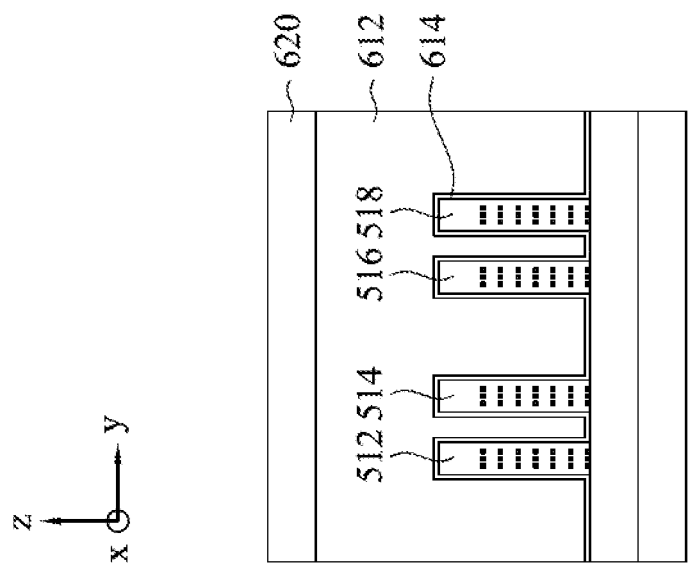
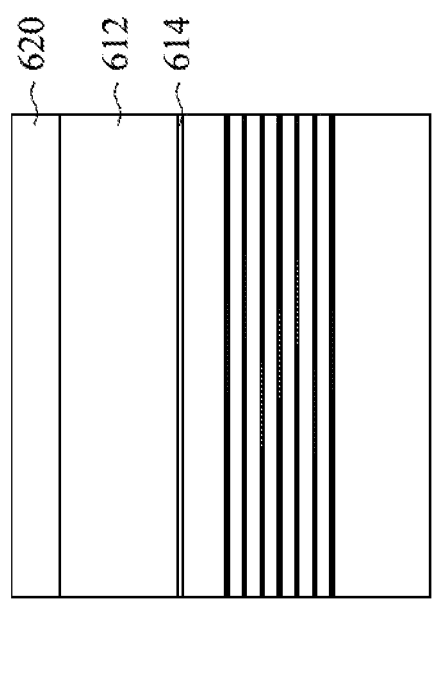
FIG. 6C
FIG. 6B

GATE ALL AROUND SEMICONDUCTOR STRUCTURE WITH DIFFUSION BREAK

BACKGROUND

As the semiconductor industry has progressed into nanometer technology process nodes in pursuit of higher device density, higher performance, and lower costs, challenges from both fabrication and design issues have resulted in the development of three-dimensional designs, such as GAA structures. Non-Si based low-dimensional materials are promising candidates to provide superior electrostatics (e.g., for short-channel effect) and higher performance (e.g., less surface scattering). Carbon nanotubes (CNTs) are considered one such promising candidate due to their high carrier mobility and substantially one dimensional structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A and 1B illustrate an example GAA structure with diffusion break structures in accordance with the present disclosure;

FIGS. 4A-23 illustrate a wafer in various stages of fabrication under the example fabrication process of FIG. 3.

DETAILED DESCRIPTION

Figure 2A:
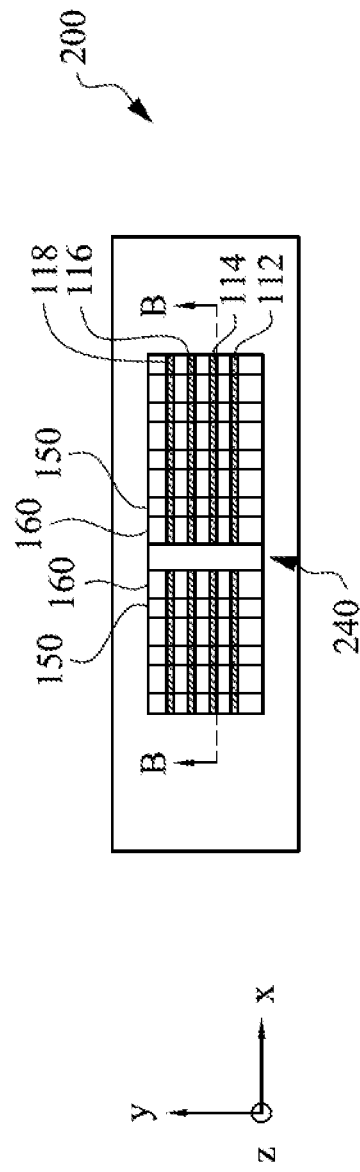
FIGS. 2A and 2B illustrate another example GAA structure with diffusion break structures in accordance with the present disclosure.

Semiconductor structures, such as CMOS devices, continue to be scaled to smaller sizes to meet advanced performance targets. Due to the extra high density and extra small device dimensions, after metal gates are formed in a semiconductor structure, some metal gate structures or sacrificial gate structures may need to be removed by etching to form gate line-end regions, for various reasons. For example, gate line-end regions are used to achieve end cap space or to isolate separate logic active areas through a diffusion break.

The current disclosure describes techniques for forming semiconductor structures having multiple vertically arranged semiconductor strips configured as channel portions. In the semiconductor structures, diffusion break structures are formed subsequent to the gate structures so that the structural integrity of the semiconductor strips adjacent to the diffusion break structures will not be compromised by a subsequent gate formation process. The diffusion break structures each extends downward from an upper surface, e.g., about a same level as upper surfaces of the gate structures, until all the semiconductor strips of the adjacent channel portions are truncated by the diffusion break structure. The semiconductor strips of the adjacent channel region refer to the semiconductor strips used or to be used as channel portions for the devices adjacent to the diffusion break. In a case that an adjacent device does not use all the vertically arranged semiconductor strips as channel strips, the diffusion break structure may truncate only the semiconductor strips that are used as channel strips. It should be appreciated that devices in an integrated circuit or formed on a same semiconductor die or wafer may include different numbers of semiconductor strips in the channel portions thereof. So it is possible that the diffusion break structures may have different depths and may truncate different number of semiconductor strips.

In an embodiment, a diffusion break structure truncates all the semiconductor strips vertically stacked over the substrate, but does not extend into the substrate. That is, the diffusion break structure is formed over the substrate. The diffusion break structure may be formed between two immediately adjacent gate structures, e.g., referred to as "double diffusion break," or may be formed by removing at least partially a gate structure, e.g., a gate electrode of a gate structure, and replacing the removed gate structure with a dielectric material, which is referred to as "single diffusion break." For each of the double diffusion break structure or the single diffusion break structure, the depth of the diffusion break is configured to be sufficiently large to truncate the semiconductor strips but does not extend into the substrate under the semiconductor strips.

The diffusion break structures are formed after the gate structures, sacrificial gate structures or replacement gate structures, are made over the semiconductor strips. More specifically, the diffusion break structures separate the semiconductor strips. As such, the diffusion break structure contacts the edge surfaces of the truncated semiconductor strips. The semiconductor strips are truncated by etching before the diffusion break structure is formed. So the edge surfaces of the truncated semiconductor strips include facet shapes that are created by the etching. Such facet shapes of the edge surfaces may be different than the facet shapes of the semiconductors edge surfaces created by an epitaxial process.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanied drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed. In the present disclosure, a phrase "one of A, B and C" means "A, B and/or C" (A, B, C, A and B, A and C, B and C, or A, B and C), and does not mean one element from A, one element from B and one element from C, unless otherwise described.

In some embodiments, semiconductor devices include a novel structure of field-effect transistors including stacked, gate-all-around (GAA) semiconductor channel strips of nanowire, nanosheet, or carbon nanotubes (CNTs). The semiconductor devices include an array of aligned channel strips with a gate dielectric layer wrapping therearound and a gate electrode layer. The gate-all-around field effect transistors (GAA FETs) can be applied to logic circuits in advanced technology node. In the description herein, a GAA device having semiconductor channel strips of CNTs are used as an illustrative example to describe the current techniques. It should be appreciated that similar techniques can also be applied to other type of semiconductor channel strips, which are included in the disclosure.

FIGS. 1A-1B show an example structure 100 having a double diffusion break structure. FIG. 1A is a top plane view from cross-section line A-A (FIG. 1B). FIG. 1B is a side cross-sectional view from cross-sectional line B-B (FIG. 1A). Referring to FIGS. 1A and 1B together, the structure 100 includes a substrate 110 and a plurality of (shown as four) stacks 112, 114, 116, 118 of semiconductor strips over the substrate 110. Each of the plurality of stacks 112, 114, 116, 118, shown as the stack 114, includes a plurality of semiconductor layers 114(1), 114(2), 114(3), 114(4) arranged vertically with respect to one another. Each semiconductor layer 114(1), 114(2), 114(3), 114(4) may also include one or more semiconductor strips, e.g., nanowires, nanosheets or carbon nanotubes, arranged laterally as a group, which is also included in the disclosure. In the description herein, without losing generality, the numerals 112, 114, 116, 118 are also used to generally refer to a semiconductor layer or a semiconductor strip in a respective stack. A semiconductor nanowire generally refers to a strip-shaped semiconductor layer that has a substantially circular cross-sectional shape with a diameter ranging between about 2 nm and about 15 nm. A semiconductor nanosheet generally refers to a strip-shaped semiconductor layer that has a substantially rectangular cross-sectional shape with a height ranging between about 2 nm and about 10 nm and a width ranging between about 4 nm to about 50 nm. In the description herein, for descriptive purposes, the term "semiconductor strip" is used generally to refer to a discrete semiconductor layer that is strip-shaped and includes various cross-sectional shapes including, but not limited to, nanowire or nanosheet.

The semiconductor strips 112, 114, 116, 118 may be Si, Ge, SiGe, GaN, GaAs, InN, InAs, CNT or other suitable semiconductor materials.

Two circuit regions 120, 130 are formed over the stacks 112, 114, 116, 118 of semiconductor strips. The two circuit regions 120, 130 are separated by a diffusion break structure 140. Specifically, the diffusion break structure 140 truncates the semiconductor strips 112, 114, 116, 118 between the two circuit regions 120, 130 such that currents do not flow between the two regions 120, 130 through the semiconductor strips 112, 114, 116, 118. More specifically, the diffusion break structure 140 separates the semiconductor strips 112, 114, 116, 118 into two vertical arrays in the circuit regions 120, 130, respectively. The semiconductor strips 112, 114, 116, 118 in the two arrays are in lateral alignment with one another. For each of the two circuit regions 120, 130, the currents are not designed to flow or leak through the substrate 110. As such, the diffusion break structure 140 extends from an upper surface 142 to a lower surface 144 that is higher than or substantially at a same level as an upper surface of the substrate 110. That is, the diffusion break structure 140 is formed over the substrate 110 and is not embedded within the substrate 110. The lower surface 144 is lower than the lowest semiconductor strip, e.g., 114(4), in the respective stack 112, 114, 116, 118 such that the diffusion break structure 140 separates all the semiconductor strips 112, 114, 116, 118. In the description of the relative positions among structures or layers, the relative terms of "higher" or "lower" "upper" or "bottom" are used in respect to the substrate 110, which is defined as lower than all the structures formed thereover.

Each of the circuit regions 120, 130 may include one or more gate structures 150 and two or more source/drain structures 160 adjacent to the gate structures 150. The gate structure 150 includes gate electrode 152 and a gate dielectric layer (not specifically shown in FIGS. 1A, 1B for simplicity purposes). Optionally, a spacer 162 of a dielectric material, e.g., silicon oxide or silicon nitride, insulates the gate structure 150 from the adjacent source/drain structure 160. For simplicity purposes, FIG. 1A does not show the spacer 162. In an embodiment, the lower surface 144 of the diffusion break structure 140 is substantially at a same level as a bottom surface of the gate structure 150, which wraps around all the semiconductor strips 112, 114, 116, 118.

As shown in the double diffusion break scenario of FIG. 1A, 1B, the diffusion break structure 140 is positioned more proximate to the most adjacent gate structure 150 than to the most adjacent source/drain structure 160. In an embodiment, the diffusion break structure 140 is formed in a space between two immediately adjacent gate structures 150. In an embodiment, a width W1 of the diffusion break structure 140 is substantially equal to a width W2 of a source/drain structure 160.

In an embodiment, the diffusion break structure 140 interfaces with termination edges 170 of the semiconductor strips 112, 114, 116, 118. Because the diffusion break structure 140 is formed after the gate structure 150 and/or the spacers 162 are formed, the termination edge surface 170 of the semiconductor strips 112, 114, 116, 118 may be substantially plumb with the adjacent spacer 162.

Figure 2B:
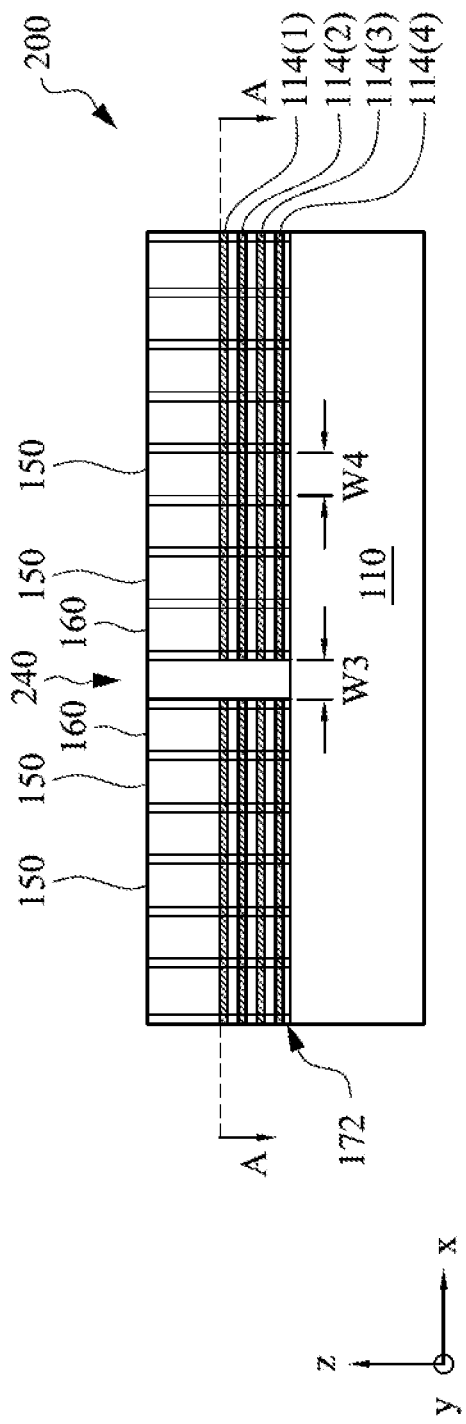

FIGS. 2A, 2B show an example structure 200 of a single diffusion break structure. The structure 200 is very similar to the structure 100 except for the single diffusion break structure 240. As shown in FIGS. 2A, 2B, the single diffusion break structure 240 is more proximate to the most adjacent source/drain structure 160 than to the most adjacent gate structure 150. A width W3 of the single diffusion break is substantially equal to a width W4 of the gate structure 160. In some circuit designs, the gate structures 150 may include different width, e.g., long gate versus short gate. The width W3 of the diffusion break structure 240 is substantially similar to the width of one of the long gate or the short gate, usually the short gate.

Referring to FIGS. 1A, 1B, 2A, 2B together, the gate structures 150 wrap around sidewall surfaces of the semiconductor strips 112, 114, 116, 118 to maximize the gate control of the charge carrier flow through the semiconductor strips 112, 114, 116, 118. The charge carriers are prevented from flowing through the substrate 110 via one or more of gate control, doping, separation or insulation. For example, the lowest semiconductor strip 114(4) is separated from the substrate 110 by a gap 172. For example, the substrate 110 may be doped to have P-N junction with the source/drain structure 160 to prevent charge carriers from flowing between the source/drain structure 160 and the substrate 110.

The substrate 110 may include a silicon substrate in crystalline structure and/or other elementary semiconductors like germanium. Alternatively or additionally, the substrate 110 may include a compound semiconductor such as silicon carbide, gallium arsenide, indium arsenide, and/or indium phosphide. Further, the substrate 110 may also include a silicon-on-insulator (SOI) structure. Substrate 110 may include an epitaxial layer and/or may be strained for performance enhancement. The substrate 110 may also include various doping configurations depending on design requirements such as P-type substrate and/or N-type substrate and various doped regions such as P-wells and/or N-wells.

The gate structures 150 are replacement gate structures. The following description lists examples of materials for the gate structure 150 including the gate electrode 152 and the gate dielectric (not specifically shown in FIGS. 1A, 1B, 3A, 2B for simplicity), which are non-limiting. The gate electrode 152 includes a conductive material, e.g., a metal or a metal compound. Suitable metal materials for the gate electrode 152 include ruthenium, palladium, platinum, tungsten, cobalt, nickel, hafnium (Hf), zirconium (Zr), titanium (Ti), tantalum (Ta), aluminum (Al), aluminides and/or conductive metal carbides (e.g., hafnium carbide, zirconium carbide, titanium carbide, and aluminum carbide), and other suitable conductive materials. In some examples, the gate electrode 152 includes a work function adjustment layer tuned to have a proper work function for enhanced performance of the field effect transistor devices. For example, suitable N-type work function metals include Ta, TiAl, TiAlN, TaCN, other N-type work function metal, or a combination thereof, and suitable P-type work function metal materials include TiN, TaN, other P-type work function metal, or combination thereof. In some examples, a conductive layer, such as an aluminum layer, a copper layer, a cobalt layer or a tungsten layer is formed over the work function adjustment layer such that the gate electrode 152 includes a work function layer disposed over the gate dielectric and a conductive layer disposed over the work function layer. In an example, the gate electrode 152 has a thickness ranging from about 5 nm to about 40 nm depending on design requirements.

In example embodiments, the gate dielectric layer includes an interfacial silicon oxide layer, e.g., thermal or chemical oxide having a thickness ranging from about 5 to about 10 angstrom (Å). In example embodiments, the gate dielectric layer further includes a high dielectric constant (high-K) dielectric material selected from one or more of hafnium oxide ($HfO_2$), hafnium silicon oxide (HfSiO), hafnium silicon oxynitride (HfSiON), hafnium tantalum oxide (HMO), hafnium titanium oxide (HfTiO), hafnium zirconium oxide (HfZrO), combinations thereof, and/or other suitable materials. A high K dielectric material, in some applications, includes a dielectric constant (K) value larger than 6. Depending on design requirements, a dielectric material of a dielectric contact (K) value of 7 or higher is used. The high-K dielectric layer may be formed by atomic layer deposition (ALD) or other suitable technique. In accordance with embodiments described herein, the high-K dielectric layer of the gate dielectric layer includes a thickness ranging from about 10 to about 30 angstrom (Å) or other suitable thickness.

The spacer 162 is formed of a low K dielectric material such as silicon oxynitride ($SiO_xN_y$), silicon nitride ($Si_3N_4$), silicon monoxide (SiO), silicon oxynitrocarbide (SiONC), silicon oxycarbide (SiOC), silicon carbide (SiC), hafnium oxide ($HfO_2$) vacuum and other dielectrics or other suitable materials. The spacer 162 may be formed through chemical vapor deposition (CVD), high density plasma CVD, spin-on, sputtering, or other suitable approaches.

The material of the source/drain structure 160 may be selected based on the materials of the semiconductor strips 112, 114, 116, 118 and the device designs. For example, for N-type devices of silicon strips 112, 114, 116, 118, the source/drain structure 160 may include silicon carbide (SiC), silicon carbon phosphide (SiCP), silicon phosphide (SiP) or other suitable semiconductor materials. For P-type devices of silicon or silicon germanium strips 112, 114, 116, 118, the source/drain structure 160 may include silicon germanium (SiGe) or silicon-germanium-boron (SiGeB) or other suitable semiconductor materials. The source/drain structure 160 may be doped in various approaches with various dopants/impurities, like arsenic, phosphorous, boron, gallium, indium, antimony, oxygen, nitrogen, or various combinations thereof.

In an embodiment, the semiconductor strips 112, 114, 116, 118 are not doped, e.g., intrinsic, to facilitate charge carrier flow under proper gate control by the gate structures 150.

Figure 3:
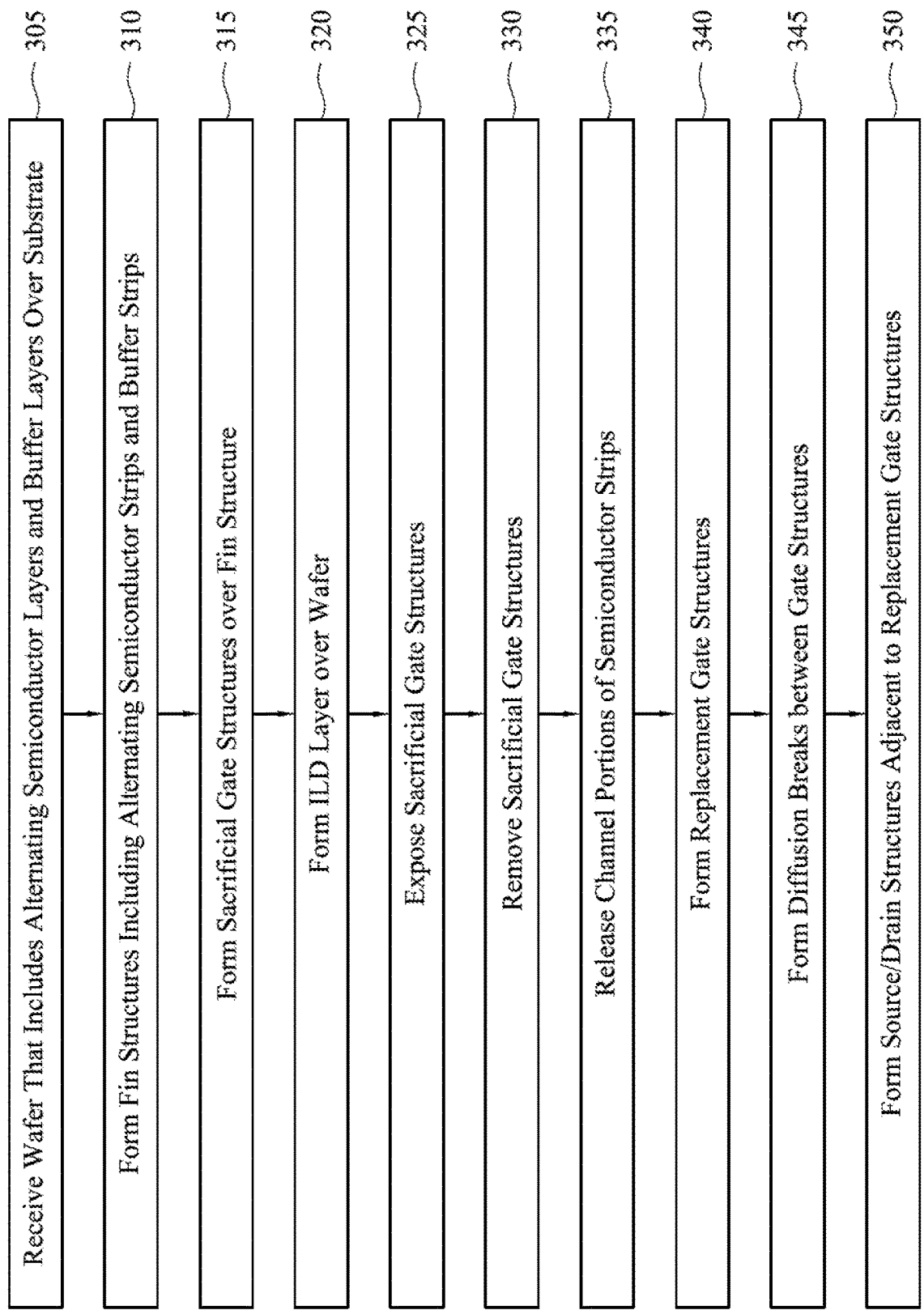
FIG. 3 is an example fabrication process in accordance with the present disclosure.
Figure 4A:
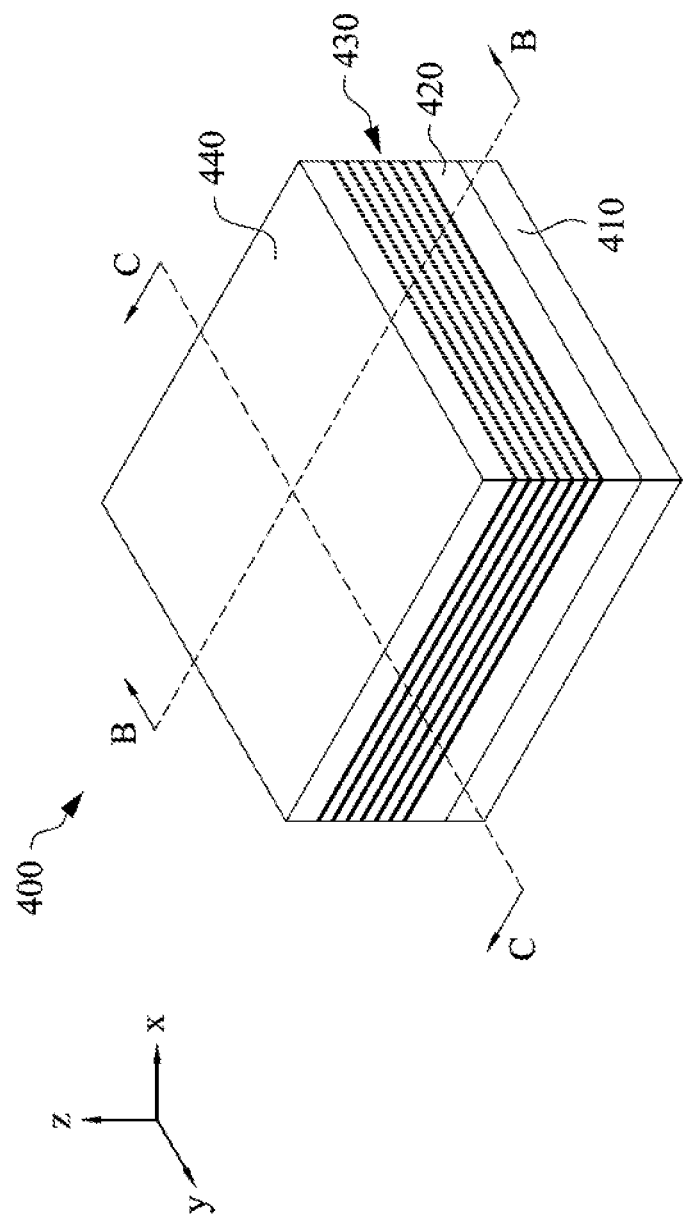

FIG. 3 shows an example process 300. FIGS. 4A-23 show a wafer 400 in various stages of fabrication under the example process of FIG. 3. At each stage, one or more of three views of the wafer 400 are shown, i.e., the perspective view referenced with letter "A," a sectional view from cutting line B-B, referenced with letter "B" and also referred to as "B" plane (X-Z plane), and a sectional view from cutting line C-C, referenced with letter "C" and also referred to as "C" plane. At some of the stages, only one view of the wafer 400 is shown and the reference letter of the respective view will be omitted for simplicity.

In the FIGS. 3 and 4A-23, a sequential fabrication process of a GAA FET using carbon nanotubes in accordance with embodiments of the present disclosure are used as an illustrative example for descriptive purposes. It is understood that additional operations can be provided before, during, and after processes shown by FIGS. 4A-23, and some of the operations described below can be replaced or eliminated, for additional embodiments of the method. The order of the operations/processes may be interchangeable. The fabrication process may be similarly used to make GAA FET of silicon nanowire channels, silicon nanosheet channels, semiconductor strips of other semiconductor materials, with appreciable variations, which are all included in the disclosure. Further, the disclosed techniques may also be used for other type of FET devices, like complementary FET devices where semiconductor channels strips of nFET and pFET are stacked on top of one another and are adjacent to a same gate structure, e.g., common gate.

Referring to FIG. 3 and FIGS. 4A-4C, in example operation 305, a wafer 400 is received. The wafer 400 includes a substrate 410, an insulation layer 420 over the substrate 410, a plurality of carbon nanotube (CNT) layers 430 are arranged on buffer layers 440 in an alternating manner. Specifically, every two immediately adjacent CNT layer 430 is vertically, e.g., in the z-axis, separated by a buffer layer 440.

In some embodiments, the substrate 410 is made of a suitable elemental semiconductor, such as silicon, diamond or germanium; a suitable alloy or compound semiconductor, such as Group-IV compound semiconductors (e.g., silicon germanium (SiGe), silicon carbide (SiC), silicon germanium carbide (SiGeC, GeSn, SiSn, SiGeSn), Group III-V compound semiconductors (e.g., gallium arsenide, indium gallium arsenide (InGaAs), indium arsenide, indium phosphide, indium antimonide, gallium arsenic phosphide, or gallium indium phosphide), or the like. An insulating material, such as a glass, may also be used as the substrate.

The insulation layer 420 is made of one or more layers of silicon oxide, silicon nitride, SiON, SiOC, SiOCN and SiCN, or other suitable dielectric material.

In some embodiment, the lowest CNT layer 430 is positioned directly over the insulation layer 420. In some other embodiment, a lowest buffer layer 440, also called as a "bottom buffer layer," is formed between the insulation layer 420 and the lowest CNT layer 430. The bottom buffer layer 440 includes a polycrystalline or amorphous material of one or more of Si, Ge or SiGe. The bottom buffer layer 440 can be formed by suitable film formation methods, such as thermal oxidation, chemical vapor deposition (CVD), physical vapor deposition (PVD) or atomic layer deposition (ALD). In certain embodiments, silicon oxide (e.g., $SiO_2$) is used as the 440.

In the description herein, the lowest CNT layer 430 directly seating on the insulation layer 420 is used as an illustrative example for descriptive purposes. Further, the wafer 400 includes seven CNT layers 430 and seven buffer layers 440 arranged in the alternating manner, for illustrative purposes only.

At the lowest CNT layer 430, one or more carbon nanotubes (CNTs) 450 are arranged over the insulation layer 420. The CNTs are arranged on the insulation layer 420 substantially in alignment with one another in a same orientation, e.g., the x-axis orientation as illustratively shown. The deviation from the alignment orientation of the CNTs 450, here the x-axis orientation, is about ±10 degrees in some embodiments, and is about ±5 degrees in other embodiments. In certain embodiments, the deviation is about ±2 degrees. At each CNT layer 430, the CNTs 450 are arranged with a density in a range from about 50 tubes/μm to about 300 tubes/μm in some embodiments, and in other embodiments, the density is in a range from about 100 tubes/μm to about 200 tubes/μm. The length of the CNTs 450, here in the x-axis, is in a range from about 0.5 μm to about 5 μm in some embodiments, and is in a range from about 1 μm to about 2 μm in other embodiments. The average diameter of the CNTs 450 is in a range from about 1.0 nm to about 2.0 nm in some embodiments.

Carbon nanotubes can be formed by various methods, such as arc-discharge or laser ablation methods. The formed CNTs are dispersed in a solvent, such as sodium dodecyl sulfate (SDS). The CNTs can also be formed through chemical vapor deposition (CVD) on a quartz or sapphire substrate. The formed CNTs can then be transferred to and disposed on the substrate 400 to become CNTs 450, using various methods, such as a floating evaporative self-assembly method in some embodiments.

After the CNTs 450 of the lowest CNT layer 430 are disposed on the insulation layer 420, a buffer layer 440 is formed over the CNTs 450 of the lowest CNT layer 430. In some embodiments, the buffer layer 440 includes a polycrystalline or amorphous semiconductor material of one of Si, Ge and SiGe. In other embodiments, the buffer layer 440 includes a dielectric material similar to or different from that of the insulation layer 420. For example, the buffer layer 440 may be one or more layers of silicon oxide, silicon nitride, SiON, SiOC, SiOCN or SiCN, or other suitable dielectric material. In some other embodiments, the buffer layer 440 may include organic materials, such as organic polymers. The buffer layer 440 can be formed by suitable film formation methods, such as CVD, PVD or ALD. In one embodiment, ALD is used to form the buffer layer 440 for its high thickness uniformity and thickness controllability.

In some embodiment, the formation of the buffer layer 440 may include a two-step process. When the first layer of the buffer layer 440 is conformally formed over the CNT layer 430, the upper surface of the first layer of the buffer layer 440 includes a wavy shape having peaks and valleys. The thickness of the first layer of the buffer layer 440 is in a range from about 2 nm to about 10 nm in some embodiments, and is in a range from about 3 nm to 5 nm in other embodiments.

In some embodiments, after the first layer of the buffer layer 440 has been formed with the wavy upper surface, one or more planarization processes are performed to flatten the upper surface of the first layer of the buffer layer 440. The planarization operation includes an etch-back process or a chemical mechanical polishing (CMP) process. In one embodiment, a CMP operation is performed.

Then, a second layer of the buffer layer 440 is formed over the first layer. In some embodiments, the second layer of the buffer layer 440 includes the same material as the first layer in some embodiments. The thickness of the second layer of the buffer layer 440 is substantially the same as the thickness of the first layer. The difference in the thickness is within ±5% in some embodiments with respect to the average thickness.

After the buffer layer 430 has been formed over the lowest CNT layer 430, a second CNT layer 430 of CNTs 450 is disposed on the buffer layer 440. When the upper surface of the first layer of the buffer layer 430 has the wavy shape, the second CNT layer 430 of CNTs 450 may tend to be arranged at the valleys of the wavy shape.

The forming a CNT layer 430 of CNTs 450 and forming a buffer layer 440 over the CNT layer 430 are repeated to form n buffer layers 440 that each encapsulate a CNT layer 430 therebelow, where n is an integer of three or more. In some embodiments, n is up to 20. As shown in FIG. 4, n is 7 and the wafer 400 include 7 CNT layers 430 of CNTs 450. Each CNT layer 430 is embedded in or encapsulated by a respective buffer layer 440 thereover. Each CNT layer 430 is positioned over a buffer layer 440, except for the lowest CNT layer 430 that is positioned over the insulation layer 420.

In other embodiments, after the first buffer layer 440 is formed with the wavy upper surface, one or more planarization operations are performed to flatten the upper surface of the buffer layer 440. The planarization operation includes an etch-back process or a chemical mechanical polishing (CMP) process. In one embodiment, CMP is used.

In an embodiment, the CNTs 450 in a same CNT layer 430 are arranged in a substantially constant pitch and the CNTs 450 in the vertical direction are substantially aligned. However, the arrangement of the CNTs 450 in the buffer layer 440 may also have random pitch within a CNT layer 430, e.g., in the y-axis orientation. In some embodiments, when the average diameter of the CNTs 450 is $D_{CNT}$, the horizontal pitch $P_H$ of the CNTs 450 is $D_{CNT} \leq P_H \leq 10 \times D_{CNT}$. In some embodiments, two laterally adjacent CNTs 450, e.g., in the same CNT layer 430, may be in contact with one another. Further, in the vertical direction, e.g., z-axis, some CNTs 450 in different CNT layers 430 may not be aligned with one another, in some embodiments. The vertical pitch $P_V$ of the CNTs 450 is determined by the thickness of the buffer layers 440. In some embodiments, a vertical pitch $P_V$ of the CNTs 450 between immediately adjacent CNT layers 430 is $0.9 \times P_{Average} \leq P_V \leq 1.1 \times P_{Average}$, where $P_A$ is an average pitch of the multiple CNT layers 430, e.g., in z-axis. In other embodiments, the vertical pitch $P_V$ is $0.95 \times P_A \leq P_V \leq 1.05 \times P_A$.

In some embodiments, after the CNTs 450 are transferred over the substrate 410, a trimming process is performed through etching.

Figure 5A:
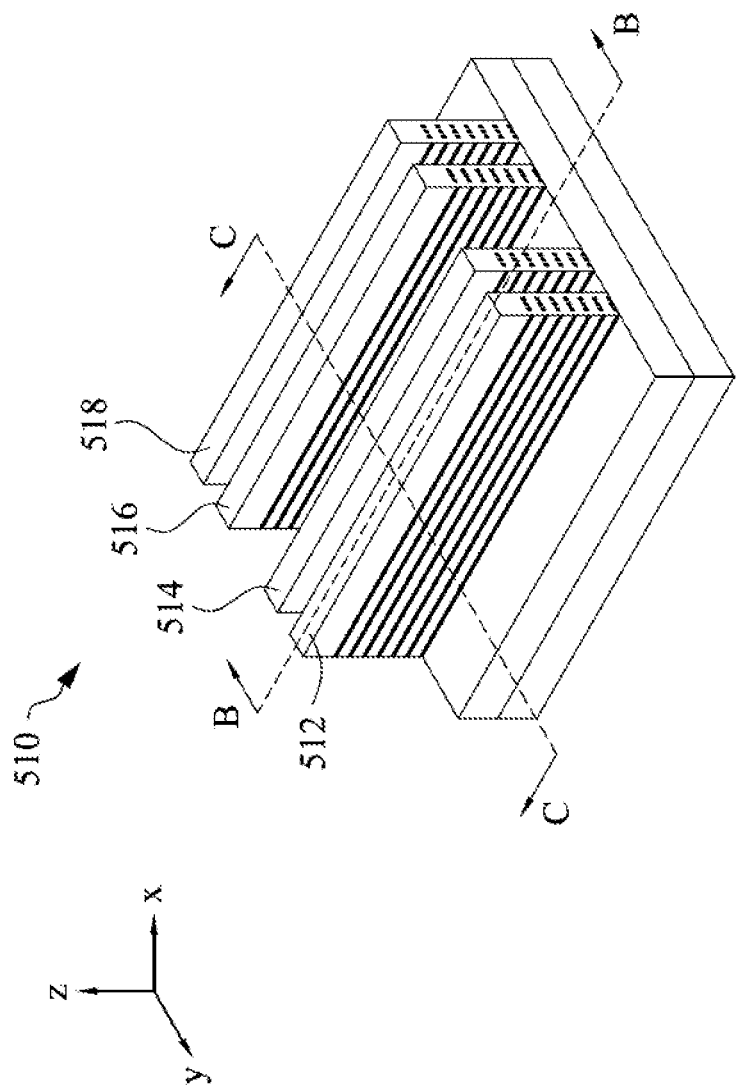

In example operation 310, with reference also to FIG. 5, fin structures 512, 514, 516, 518 are formed by patterning the CNT layers 430 and the buffer layers 440. The patterning may use one or more lithography and etching operations with a mask pattern formed over the top level buffer layer 440. The buffer layers 440 and the CNT layers 450 are patterned into one or more fin structures 510, shown as four fin structures 512, 514, 516, 518. In the description herein, the fin structures are generally referred to as fin structures 510 unless a specific fin structure 512, 514, 516, 518 is referred to in applicable scenarios. The mask pattern may be a photo resist layer in some embodiments, or a hard mask made of dielectric material in some other embodiments. In some embodiments, the fin structures 510 may be patterned by any suitable method. For example, the fin structures 510 may be patterned using one or more photolithography processes of extreme ultraviolet (EUV) lithography, double-patterning or multi-patterning processes or other photolithography processes. Generally, double-patterning or multi-patterning processes combine photolithography and self-aligned processes, which achieve patterns of smaller pitches than those obtainable using a single, direct photolithography process.

In some embodiments, the width 522 of the fin structures 510 in the y-axis orientation is in a range from about 5 nm to about 20 nm, and is in a range from about 7 nm to about 12 nm in other embodiments. In an embodiment, as shown in FIG. 5, the insulation layer 420 is made of a different material than the buffer layers 440 and thus the insulation layer 420 is not patterned. In some other embodiments, a lowest buffer layer 440 is formed between the insulation layer 420 or the substrate 410 and the lowest CNT layer 430. The lowest buffer layer 440 is also patterned into the fin structures 510.

The total number of the CNTs 450 contained in a fin structure 510 is in a range from about 5 to about 100 in some embodiments, and is in a range from about 10 about 50 in other embodiments. In each CNT layer 430 over a buffer layer 440 contained in a fin structure 510, the number of CNTs 450 may vary in a range between 1 to 15 to 15 CNTs 450 depending on the device designs and/or configurations. In an embodiment, each CNT layer 430 in a fin structure 510 includes 3 CNTs 450.

Various configurations of CNTs 450 are possible in a fin structure 512, 514, 516, 518. For example, some CNTs 450 may be partially exposed at a side surface of the buffer layer 440 in some embodiments. In such a case, a removal operation may be performed to remove the partially exposed CNTs 450. The removal operation can be a plasma treatment using oxygen containing gas.

In some embodiments, the number of CNTs 450 contained in a CNT layer 430 may vary among CNT layers 430 in a same or different fin structure 510. Further, the pitch of the CNTs 450 in one CNT layer 430 may be different from the pitch of the CNTs 450 in another CNT layer 430 in some embodiments. The pitch of the CNTs 450 may vary within a same CNT layer 430 in some embodiments. Adjacent CNTs 450 in one CNT layer 430 may be in contact with one another in some embodiments, or may be discrete from one another in some other embodiments. The CNTs 450 in different CNT layer 430 of a same fin structure 510 do not contact with one another in some embodiments.

Figure 6A:
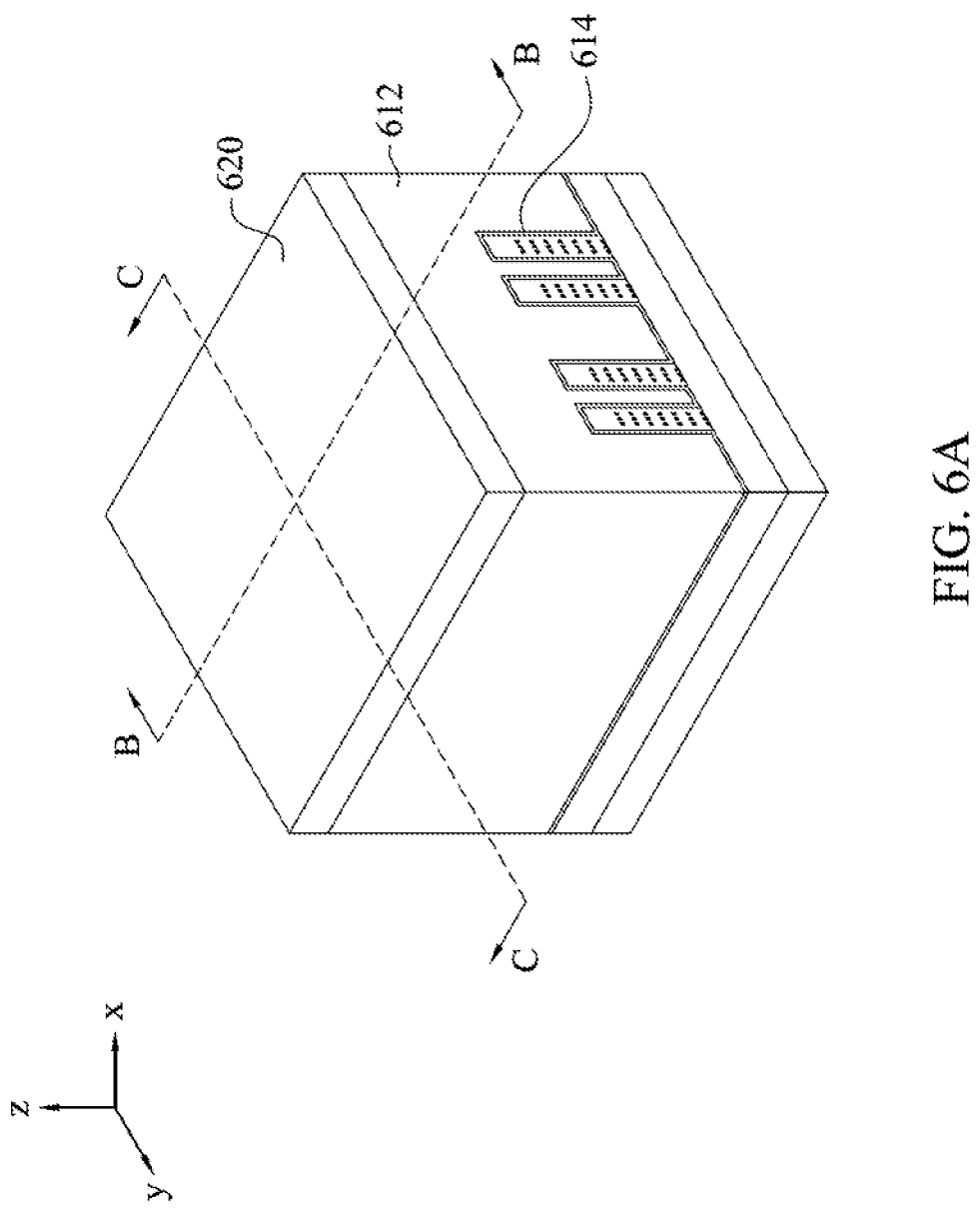
Figure 7A:
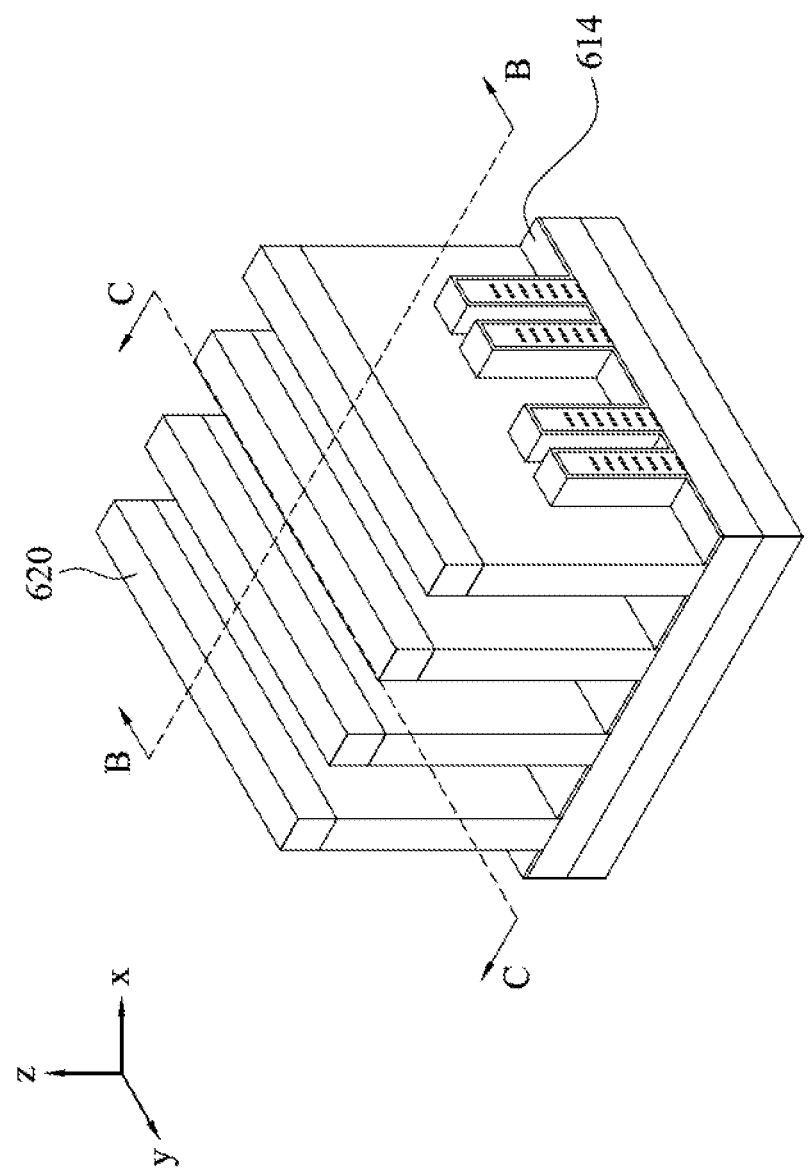
Figure 7C:
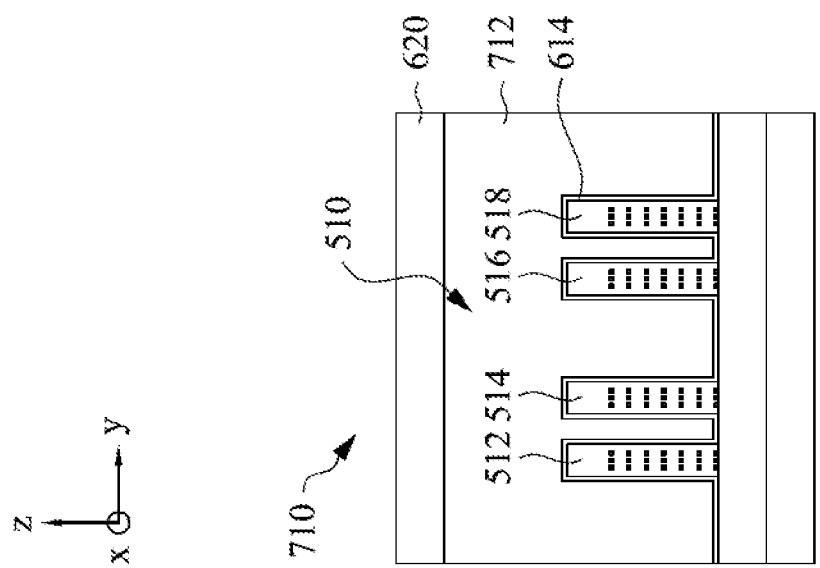
Figure 7B:
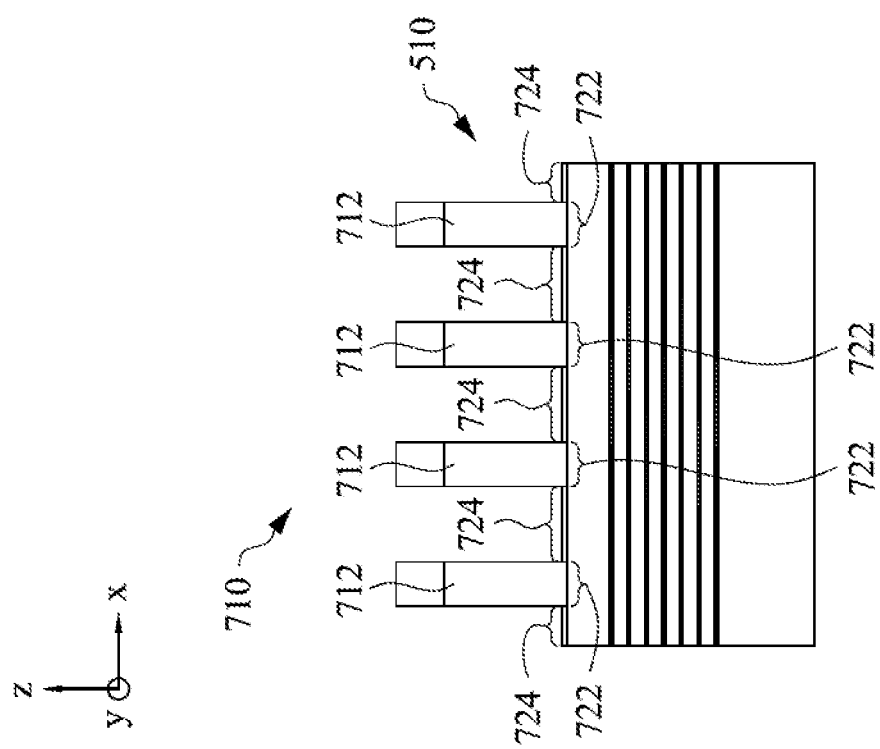

In example operation 315, with reference also to FIGS. 6 and 7, sacrificial gate structures are formed over the fin structures 510. As shown in FIG. 6, a sacrificial gate electrode layer 612 and a gate dielectric layer 614 are blankly deposited over the fin structures 510 such that the fin structures 510 are fully embedded in the sacrificial gate electrode layer 612. The sacrificial gate electrode layer 612 includes silicon, germanium or silicon germanium or other suitable materials. For example, the sacrificial gate electrode layer 612 is polycrystalline silicon or amorphous silicon. The thickness of the sacrificial gate electrode layer 612 is in a range from about 80 nm to about 200 nm in some embodiments. In some embodiments, the sacrificial gate electrode layer 612 is subjected to a planarization operation. The sacrificial gate electrode layer 612 is deposited using CVD, PVD, ALD, or other suitable processes. The gate dielectric layer 614 is optional and in some embodiments, no sacrificial gate dielectric layer is formed below the sacrificial gate electrode layer 612 depending on process or device designs.

A mask layer 620 is formed over the sacrificial gate electrode layer 612. The mask layer 620 includes one or more of a silicon nitride layer, a silicon oxide layer or other suitable hard mask layers.

Referring to FIG. 7, with the mask layer 620 patterned, the sacrificial gate electrode layer 612 is patterned into sacrificial gate electrodes 712, shown as four sacrificial electrodes 712 for illustrative purposes. The sacrificial gate electrode 712 and the gate dielectric layer 614 form sacrificial gate structure 710. With the sacrificial gate electrodes 712 being formed, the fin structures 510 are each partially exposed on opposite sides of the sacrificial gate electrodes 712. The portions of the fin structures 510 that are covered by the sacrificial gate electrodes 712 are referred to as "channel portions" 722 and the portions of the fin structures 510 that are exposed from the sacrificial gate electrodes 712 are referred to as "extension portions" 724, for descriptive purposes. In an embodiment, the source/drain (S/D) regions of a device are generally defined by the extension portions 724 of the fin structures 512. In an embodiment, a source and a drain of a device are interchangeably used and the structures thereof are substantially the same. FIG. 7 shows that four sacrificial gate electrodes 712 are formed over four fin structures 510, but the number of the sacrificial gate structures is not limited to this configuration. One or more than one sacrificial gate structures can be arranged in the x-axis direction in some embodiments. In certain embodiments, one or more sacrificial gate electrodes 712 are configured as dummy gate structures to improve pattern fidelity and/or structural integrity. A dummy gate structure refers to a gate structure that is not configured to control the flow of charge carriers. A dummy gate structure may include a same structural configuration as a normal gate structure except for the functional configuration thereof.

Optionally, an outer spacer structure is formed adjacent to the sacrificial gate electrodes 712. The outer spacer structure (not shown for simplicity) is conformally formed adjacent to the sacrificial gate electrodes 712 using CVD or other suitable methods. The layer of the outer spacer is deposited in a conformal manner so that it is formed to have substantially equal thicknesses on vertical surfaces, such as the sidewalls, horizontal surfaces, and the top of the sacrificial gate electrodes 712. In some embodiments, the outer spacer layer has a thickness ranging from about 2 nm to about 10 nm. In some embodiments, the dielectric material of the outer spacer structure is one or more of SiN, SiON, SiOCN, SiCN, or SiOC or some other suitable dielectric materials.

The outer spacer layer is etched through anisotropic etching, e.g., reactive ion etching (RIE), to form the outer spacers. During the anisotropic etching process, most of the dielectric material of the outer spacer layer is removed from the horizontal surfaces, e.g., the x-y plane, leaving the dielectric spacer layer on the vertical surfaces, such as the sidewalls of the sacrificial gate electrodes 712 and the sidewalls of the extension portions 724 of the fin structures 510. In some embodiments, an isotropic etching process may be subsequently performed to remove the dielectric material of the outer spacer layer from the extension portions 724 of the fin structures 510.

Optionally, a liner layer, such as an etch stop layer, is formed to cover the sacrificial gate electrodes 712, the outer spacer structures and the extension portions 724 of the fin structures 510. In some embodiments, the liner layer includes a silicon nitride-based material, such as silicon nitride, SiON, SiOCN or SiCN and combinations thereof, formed by CVD (including LPCVD and PECVD), PVD, ALD, or other suitable process.

Figure 8A:
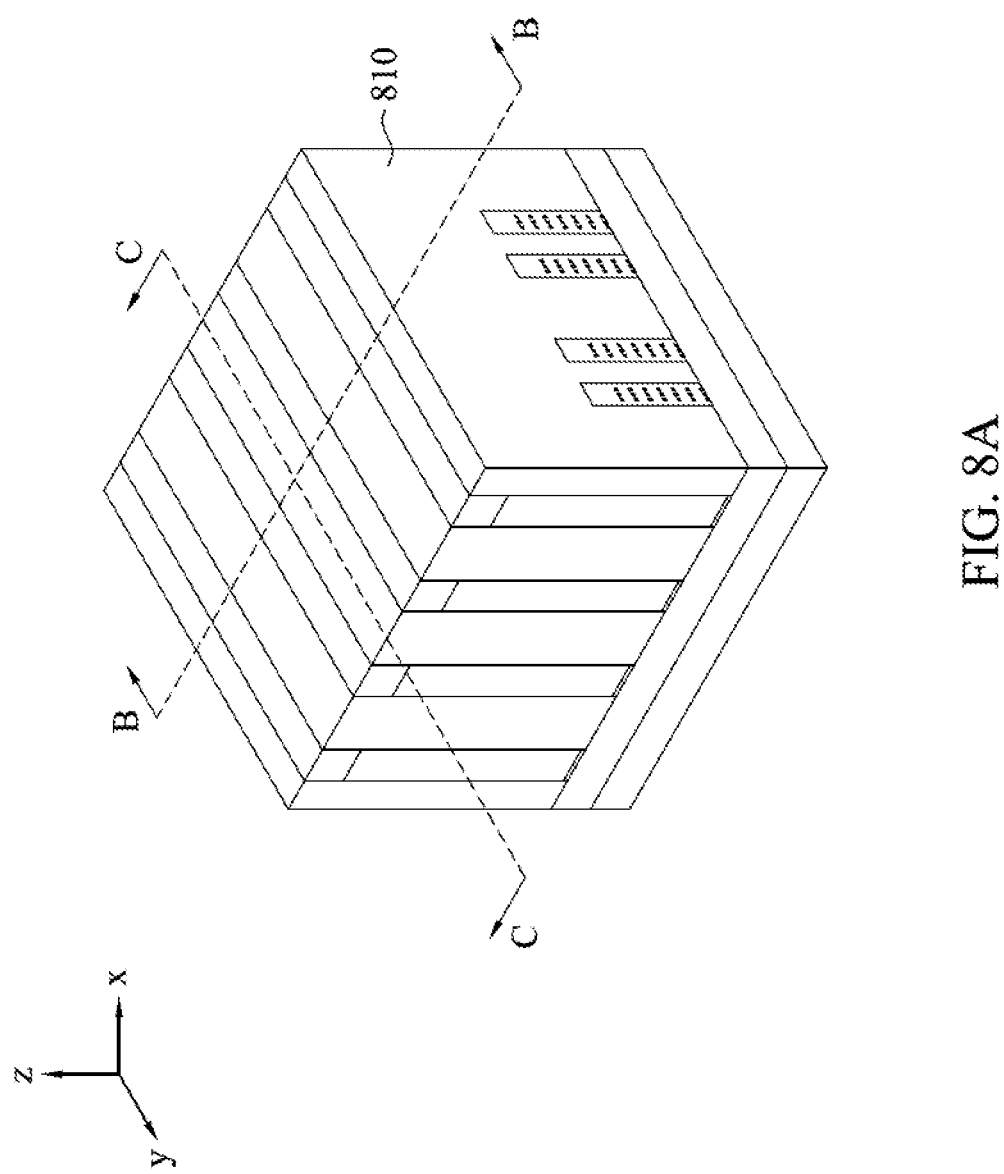
Figure 8C:
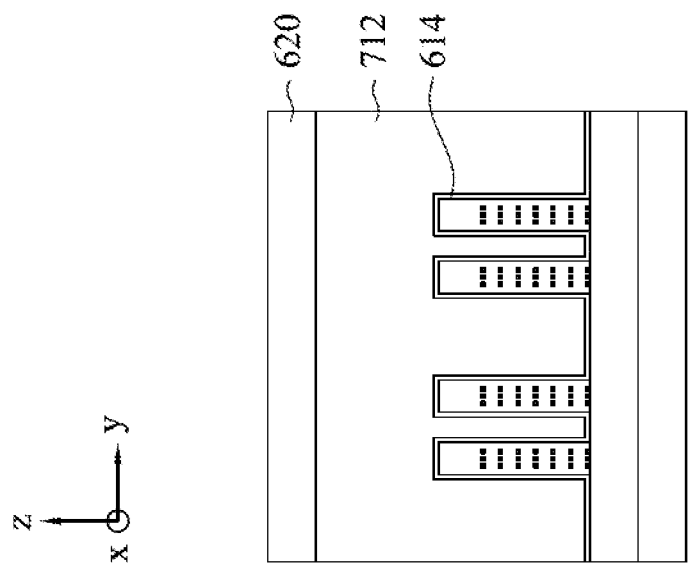
Figure 8B:
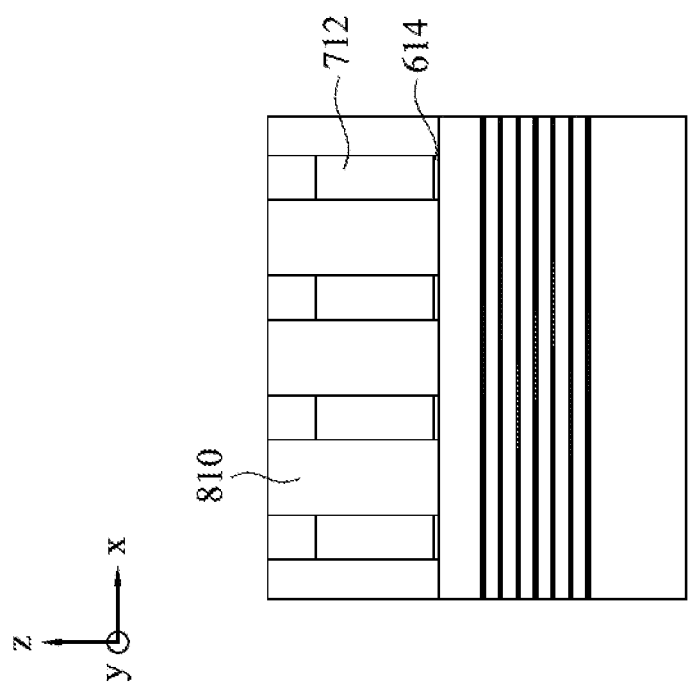

In example operation 320, with reference also to FIG. 8, a first interlayer dielectric (ILD) layer 810 is formed (FIG. 8). The materials for the first ILD layer 810 include compounds comprising Si, O, C and/or H, such as silicon oxide, SiCOH and SiOC. Organic materials, such as polymers, may also be used for the first ILD layer 810.

Figure 9A:
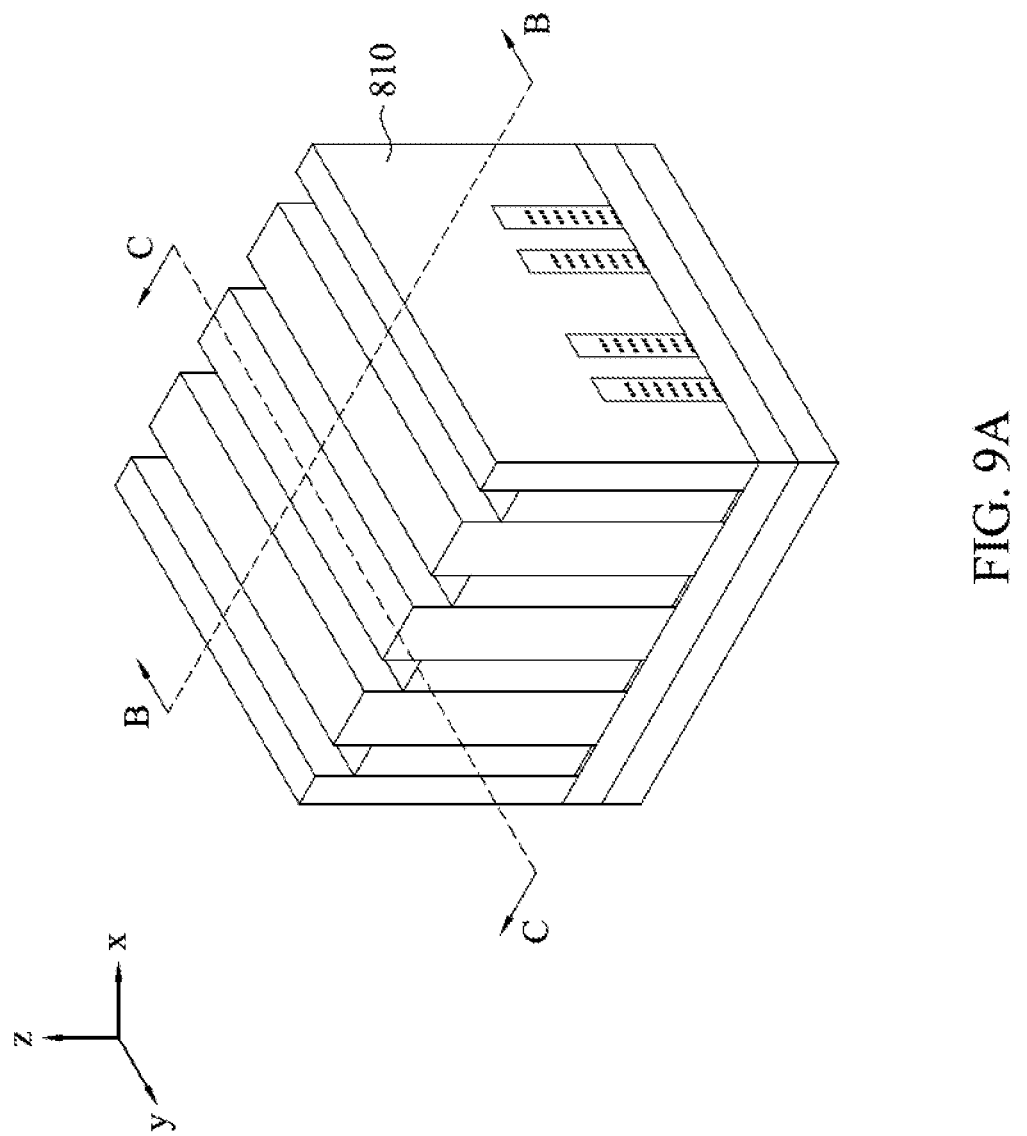
Figure 9C:
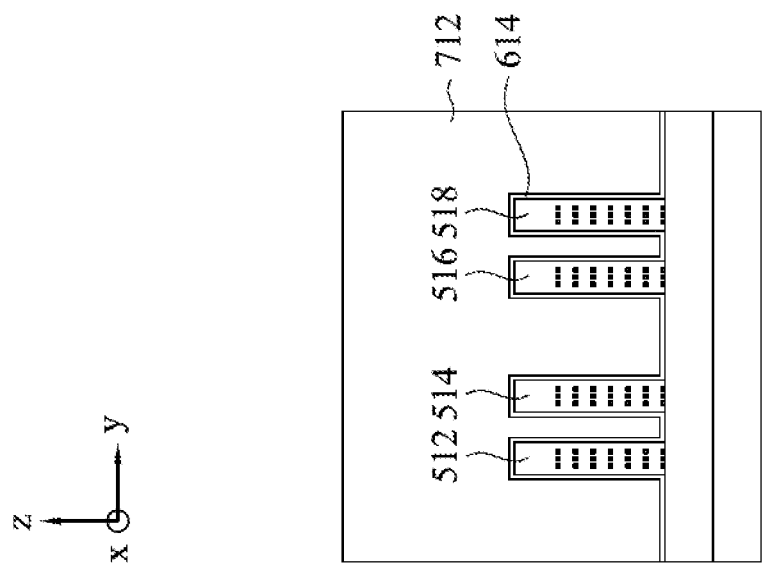
Figure 9B:
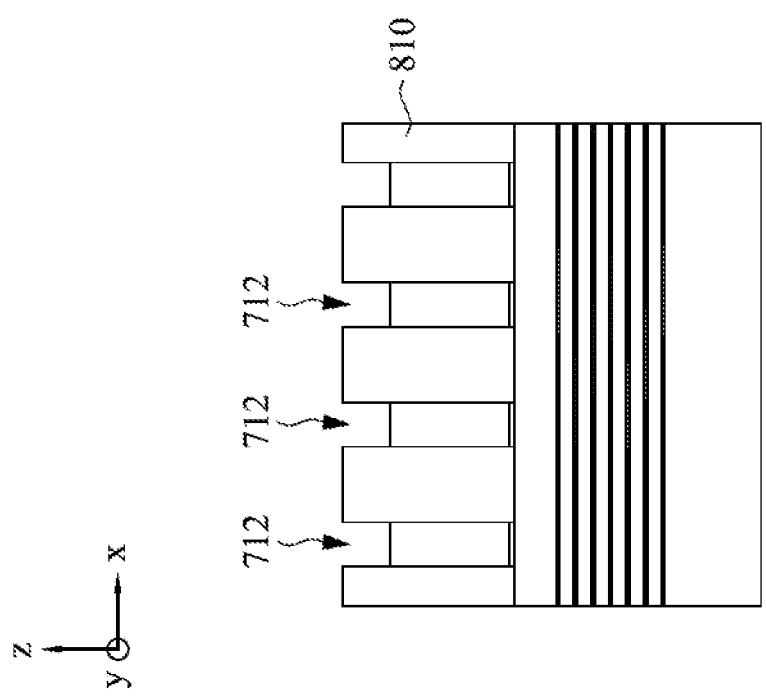

In example operation 325, with reference to FIG. 9, the sacrificial gates 712 are exposed from the ILD layer 810. In an embodiment, as shown in FIG. 9, the sacrificial gates 712 are exposed by selectively removing the mask layer 620. In another embodiment, a planarization operation, such as CMP, is performed to remove the mask layer 620 and upper portion of the ILD layer 810 so that the sacrificial gate electrodes 712 are exposed.

Figure 10A:
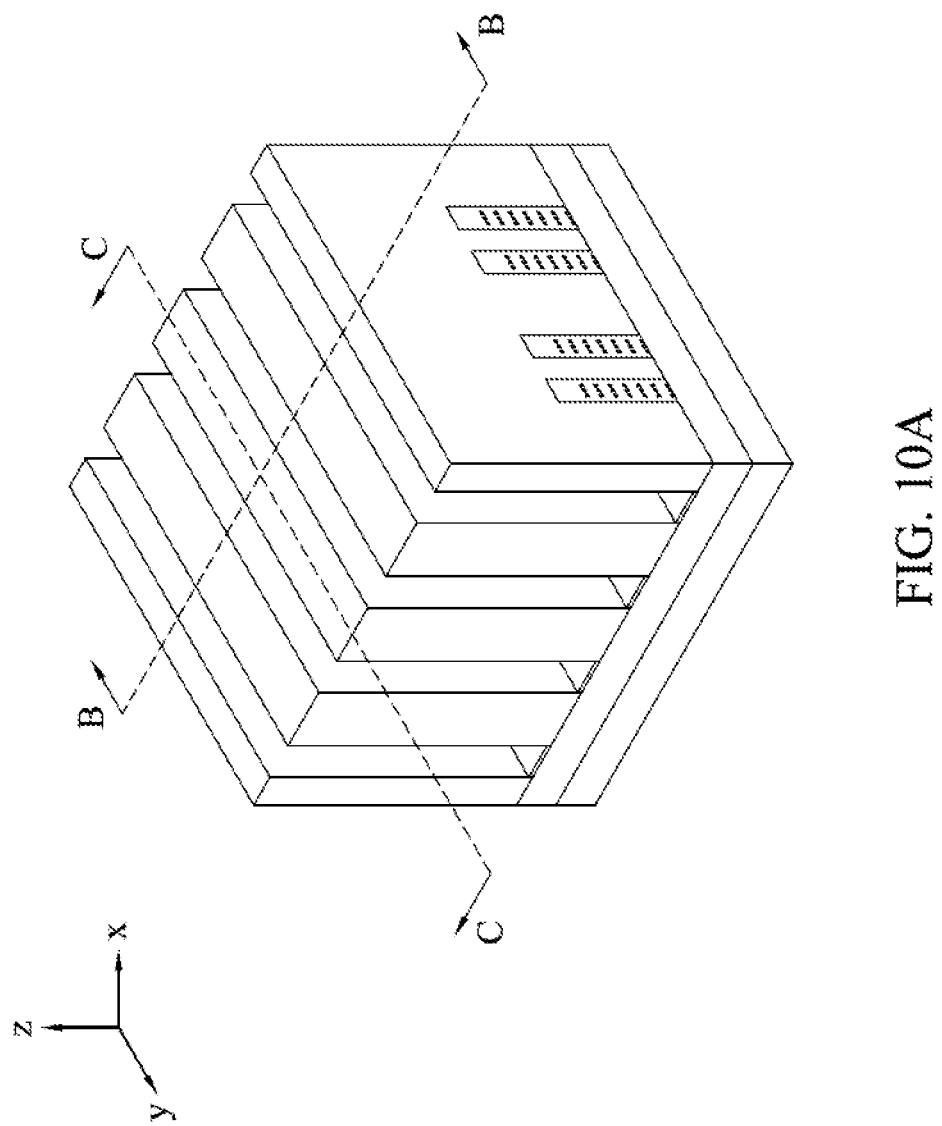
Figure 10C:
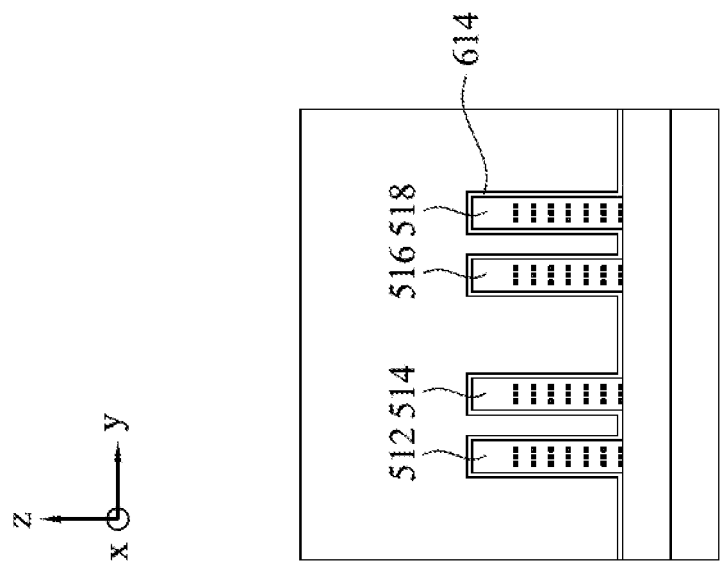
Figure 10B:
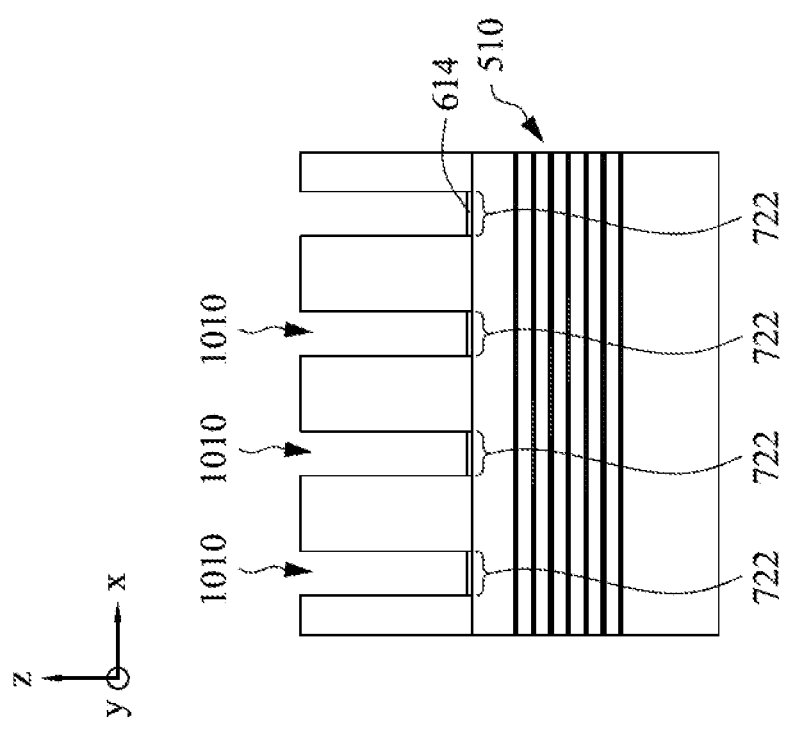

In example operation 330, with reference also to FIG. 10, the sacrificial gate electrodes 712 are removed to form gate spaces 1010, thereby exposing the channel portions 722 of the fin structures 510 by the gate spaces 1010. The sacrificial gate electrodes 712 can be removed using plasma dry etching and/or wet etching. For example, in the case that the sacrificial gate electrodes 712 is polysilicon and the ILD layer 810 is silicon oxide, a wet etchant such as a TMAH solution can be used to selectively remove the sacrificial gate electrode 712.

The gate dielectric layer 614 may be removed subsequent to the removing the sacrificial gate electrodes 712 or may remain after the removing the sacrificial gate electrodes 712.

FIG. 10 shows, as an illustration, that all the sacrificial gate electrodes 712 are removed. The disclosure is not limited by this example. Some of the sacrificial gate electrodes 712 may remain to function as dummy gate structures or may be removed in some subsequent operations to form, e.g., a diffusion break structure.

Figure 11A:
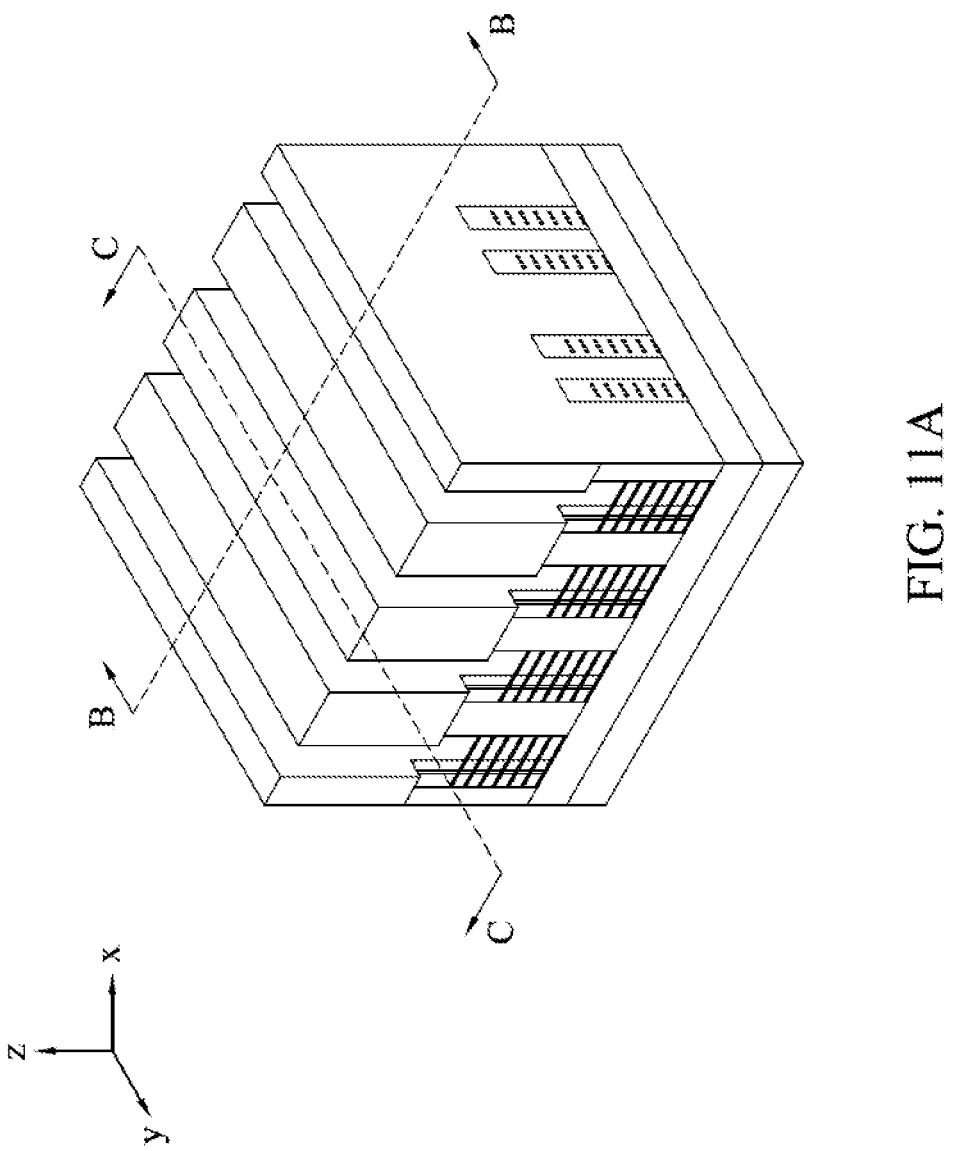
Figure 11C:
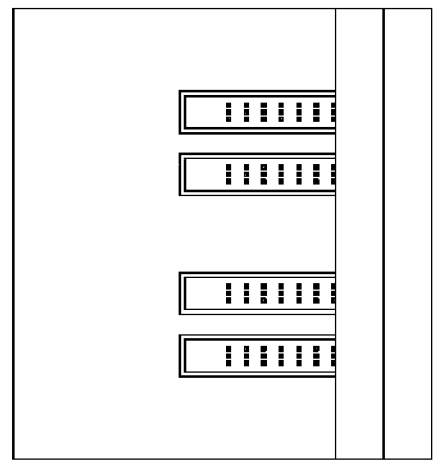
Figure 11B:
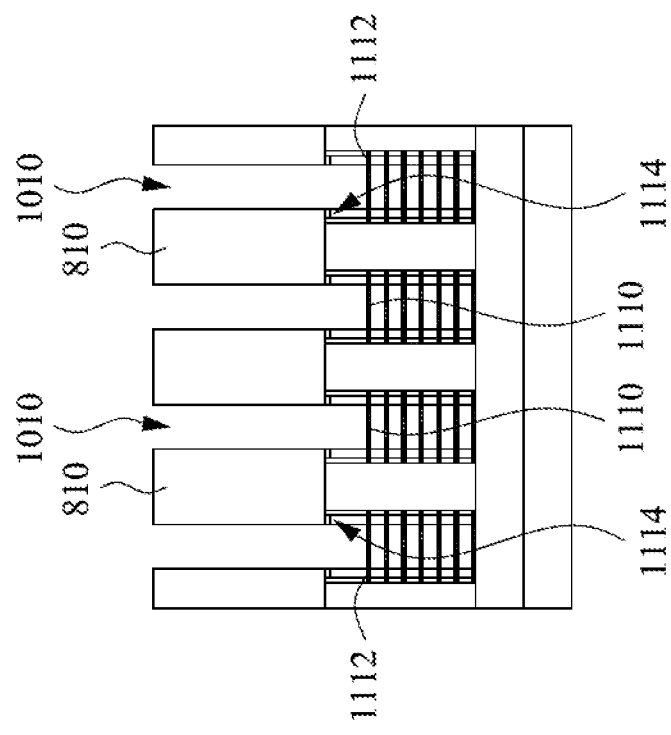
Figure 12A:
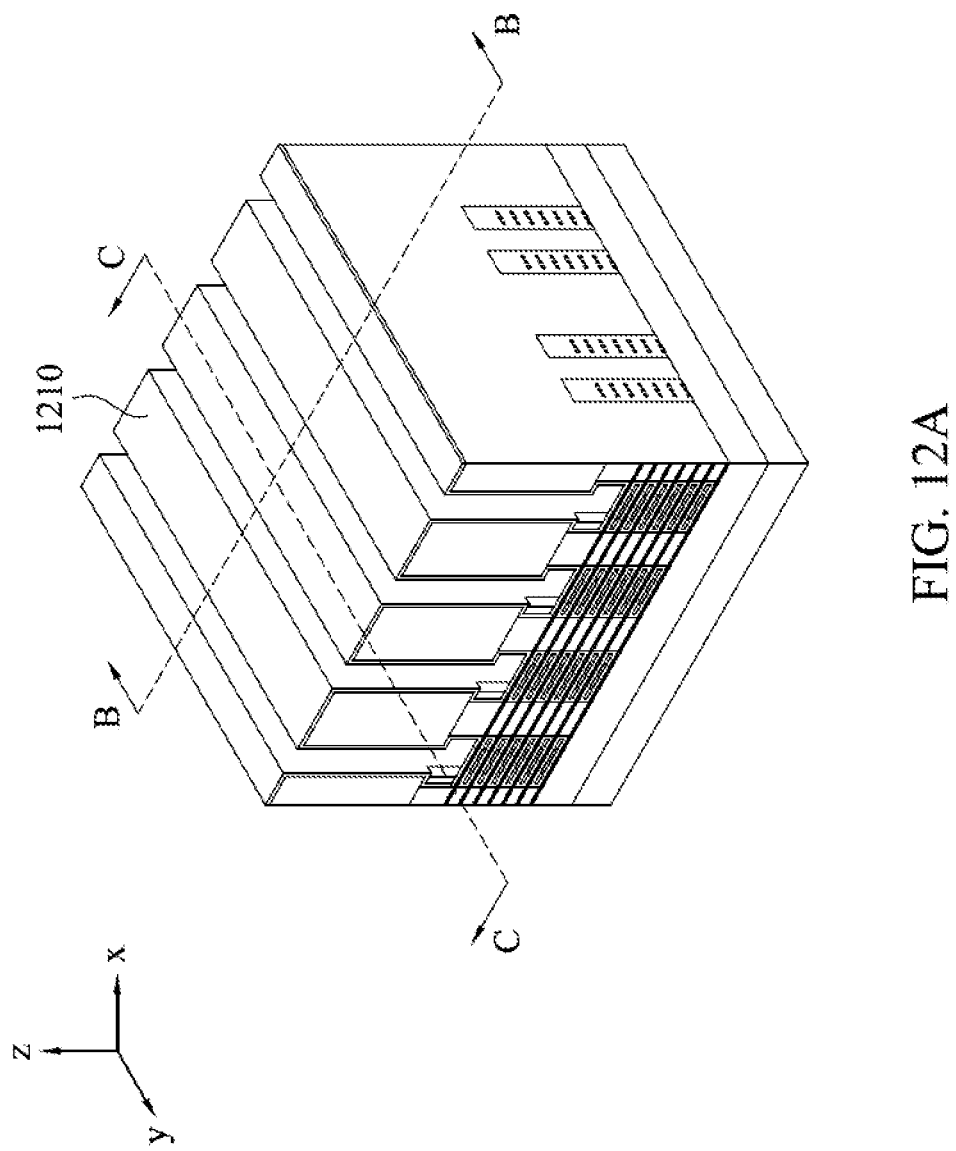
Figure 12C:
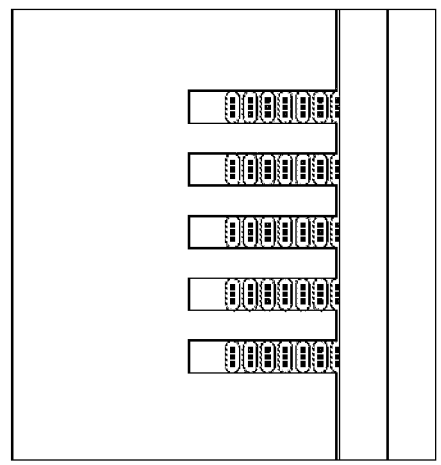
Figure 12C:
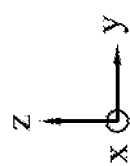
Figure 12B:
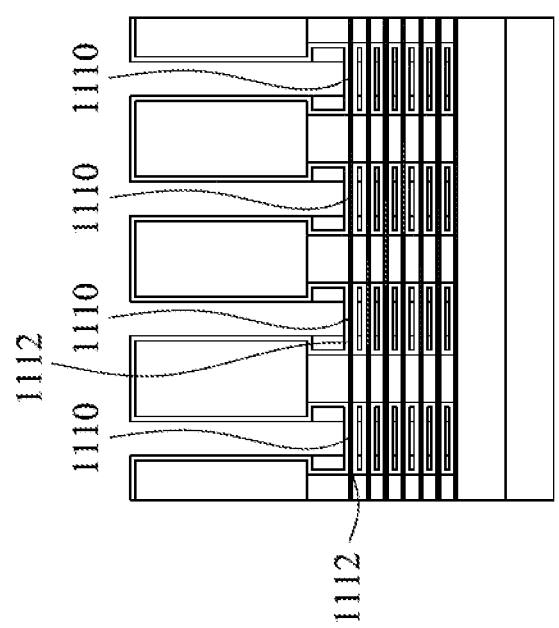
Figure 12B:
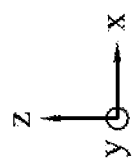

In example operation 335, with reference also to FIG. 11, the CNTs 450 are released from the channel portion 722 of the fin structures 510. Specifically, the buffer layers 440 in the channel portions 722 of the fin structures 510 are removed to release the CNTs 450. The buffer layers 440 can be removed selectively to the CNTs 450 and the ILD layer 810 using plasma dry etching and/or wet etching. When the buffer layers 440 are polysilicon or amorphous silicon and the first ILD layer 810 is silicon oxide, a wet etchant such as a TMAH solution is used. In an embodiment, in a case that the sacrificial gate electrode 712 and the buffer layers 440 are made of the same material, the removal of the sacrificial gate electrodes 712 and the removal of the buffer layers 440 in the channel portion 722 may be achieved by a same etching operation.

The portions of the CNTs 450 that are released from the channel portion 722 are referred to as channel portions 1110 of the CNTs 450. In some embodiment, some portions 1112 of the CNTs 450 under the ILD layer 810 are also released due to the undercut region 1114 formed by the etching operation. The portions 1112 of the CNTs 450 may be configured to be source/drain extension portions 1112 and may be doped to enhance the electrical characteristics of the devices. In some other embodiment, for example, when the silicon or silicon germanium nanowires or nanosheets are used as the semiconductor strips, the source/drain extension portion may not be formed.

In some embodiment, the undercut regions 1114 may also be used to form an inner spacer structure (not shown for simplicity) therein. The inner spacer structure may be configured to provide insulation between the gate structure and the source/drain structures.

In example operation 340, with reference to FIGS. 12-15, after the channel portions 1110 of the CNTs 450 are released, replacement gate structures 1510 are formed adjacent to, e.g., wrapping around, the channel portions 1110 of the CNTs 450. In some embodiment, in a case that the source/drain extension portions 1112 are also released, the replacement gate structures 1510 are also formed adjacent to the source/drain extension portions 1112.

Specifically, as shown in FIG. 12, a gate dielectric layer 1210 is formed around the channel portions 1110 of the CNTs 450. In some embodiments, the gate dielectric layer 1210 includes one or more layers of a dielectric material, such as silicon oxide, silicon nitride, or a high-K dielectric material, or other suitable dielectric material, and/or combinations thereof. Examples of high-K dielectric material include $HfO_2$, HfSiO, HfSiON, HfTaO, HfSiO, HfZrO, zirconium oxide, aluminum oxide, titanium oxide, hafnium dioxide-alumina ($HfO_2$—$Al_2O_3$) alloy, or other suitable high-K dielectric materials, and/or combinations thereof. In some embodiments, the gate dielectric layer 1210 is made of $HfO_2$ for an nFET device, and is made of $Al_2O_3$ for a pFET device. The gate dielectric layer 1210 has a thickness in a range from about 0.5 nm to about 2.5 nm in some embodiments, and has a thickness in a range from about 1.0 nm to about 2.0 nm in other embodiments. The gate dielectric layer 1210 may be formed by CVD, ALD or other suitable method. In one embodiment, the gate dielectric layer 1210 is formed using a highly conformal deposition process such as ALD in order to ensure a uniform thickness around each channel portions 1110 of the CNTs 450.

In some embodiments, an interfacial layer (not shown) is formed around the channel portions 1110 of the CNTs 450 before the gate dielectric layer 1210 is formed. The interfacial layer is made of a dielectric material, e.g., $SiO_2$, and has a thickness in a range from about 0.5 nm to about 1.5 nm in some embodiments. In other embodiments, the thickness of the interfacial layer is in a range from about 0.6 nm to about 1.0 nm.

Figure 13A:
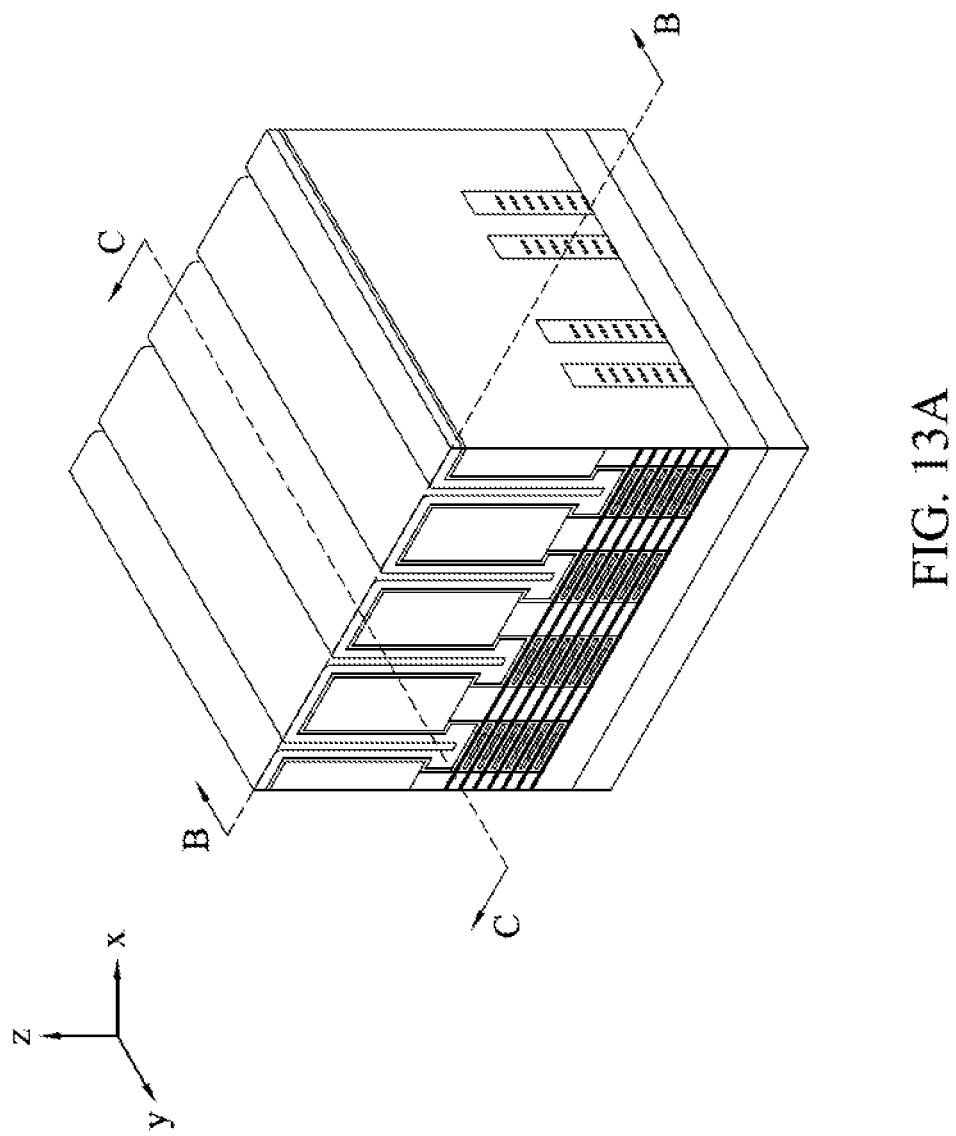
Figure 13C:
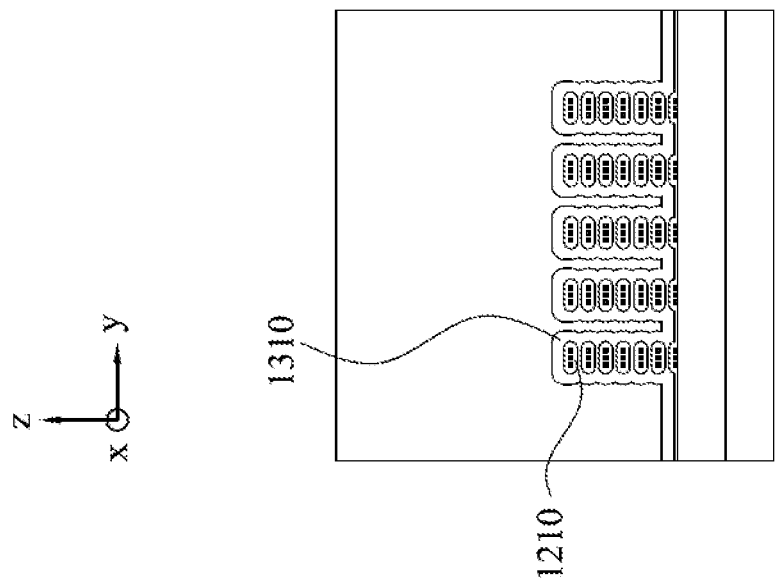
Figure 13B:
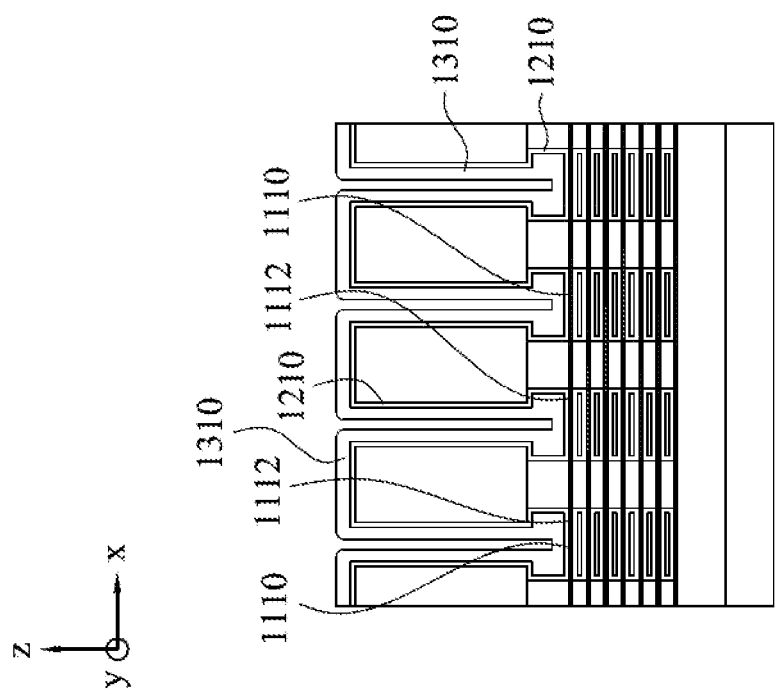

As shown in FIG. 13, in certain embodiments, one or more work function adjustment layers 1310 are formed over the gate dielectric layer 1210. The work function adjustment layers 1310 are made of a conductive material such as a single layer of TiN, TaN, TaAlC, TiC, TaC, Co, Al, TiAl, HfTi, TiSi, TaSi or TiAlC, or a multilayer of two or more of these materials. In certain embodiments, TiN is used as the work function adjustment layer 1310. The work function adjustment layer 1310 may be formed by ALD, PVD, CVD, e-beam evaporation, or other suitable process. Further, the work function adjustment layer 1310 may be formed separately for nFET or the pFET using different metal materials.

Figure 14A:
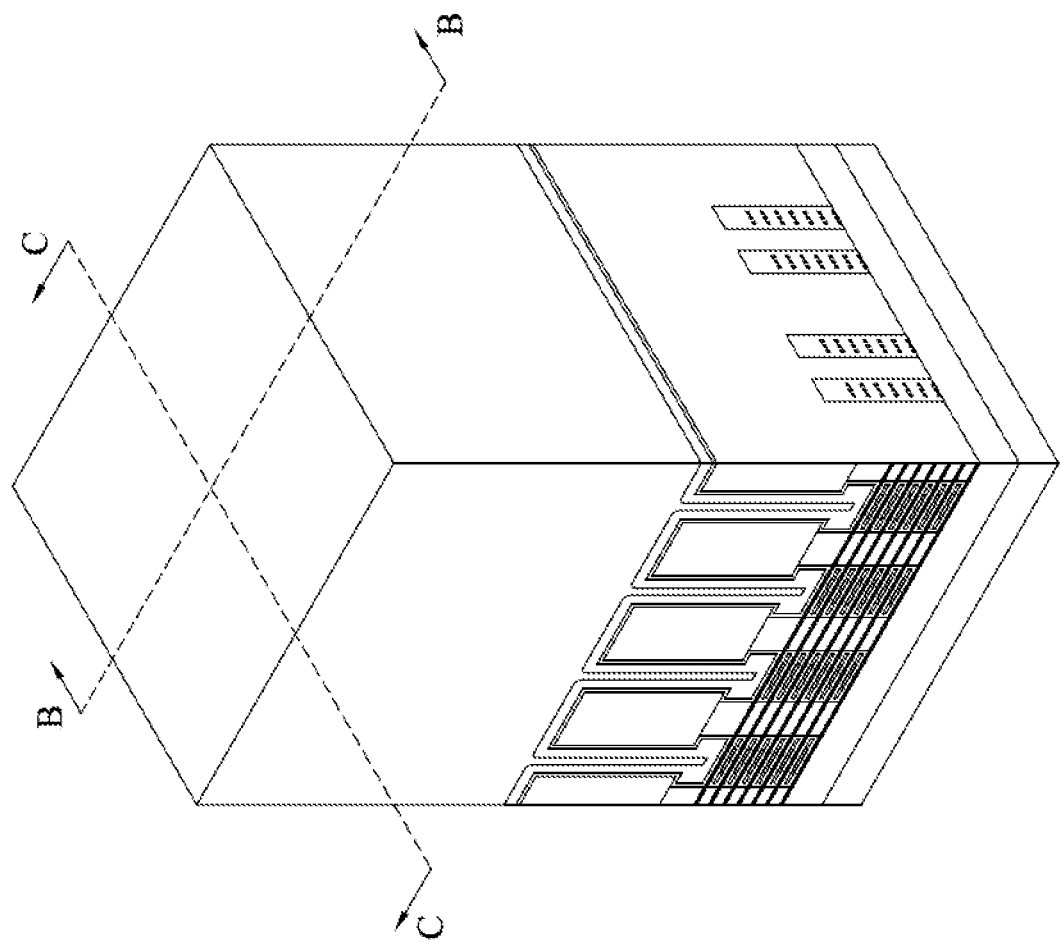
Figure 14C:
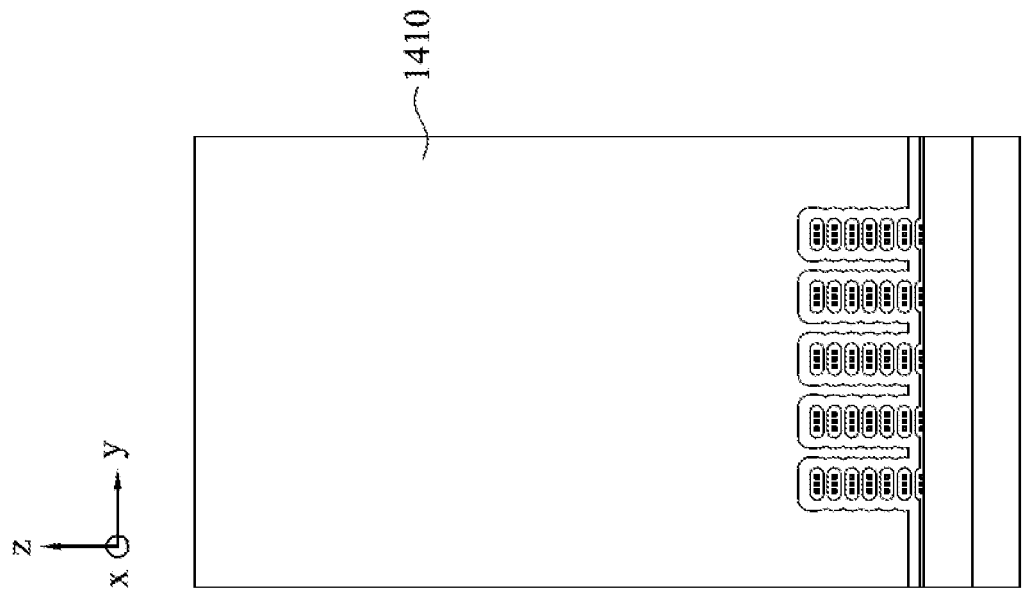
Figure 14B:
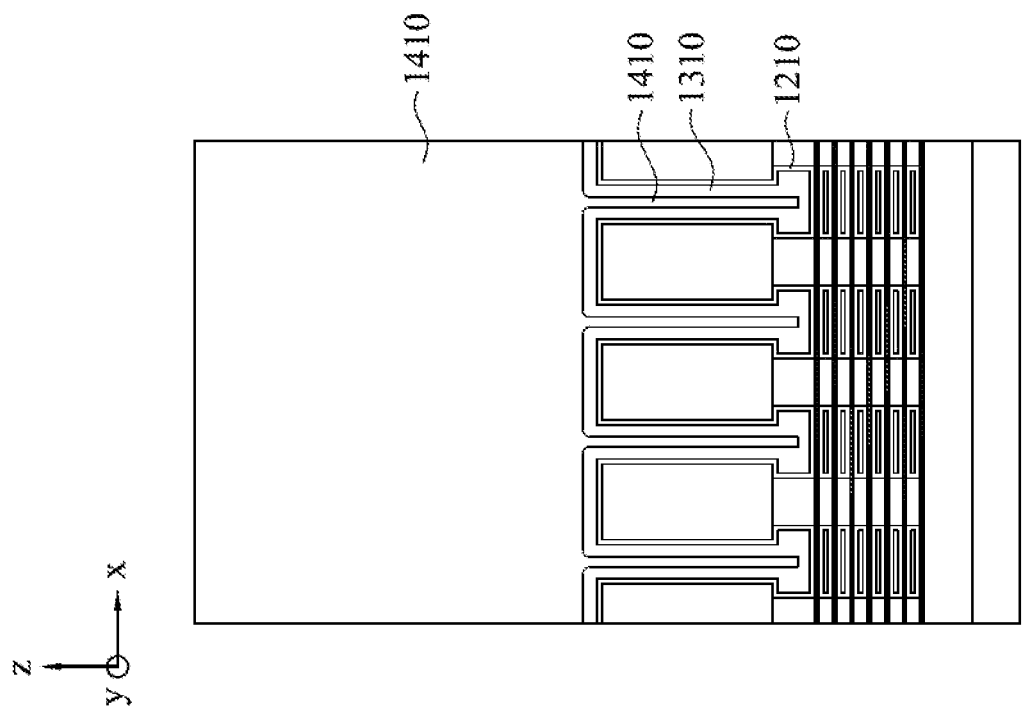

As shown in FIG. 14, a gate electrode layer 1410 is formed over the work function adjustment layer 1310. The gate electrode layer 1410 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layer 1410 has a thickness in a range from about 0.5 nm to about 5.0 nm in some embodiments, and has a thickness in a range from about 0.8 nm to about 1.5 nm in other embodiments. The gate electrode layer 1410 may be formed by CVD, ALD, electro-plating, or other suitable method.

Figure 15A:
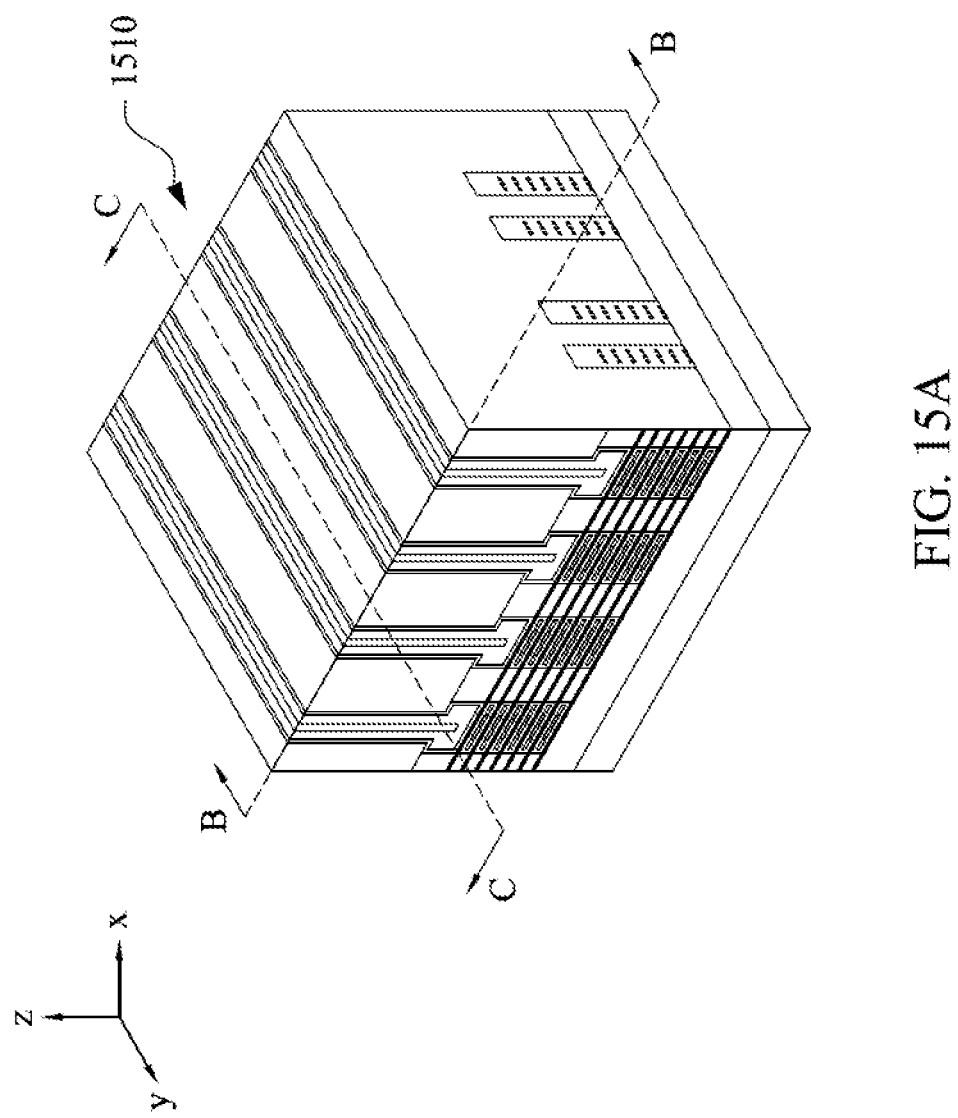
Figure 15C:
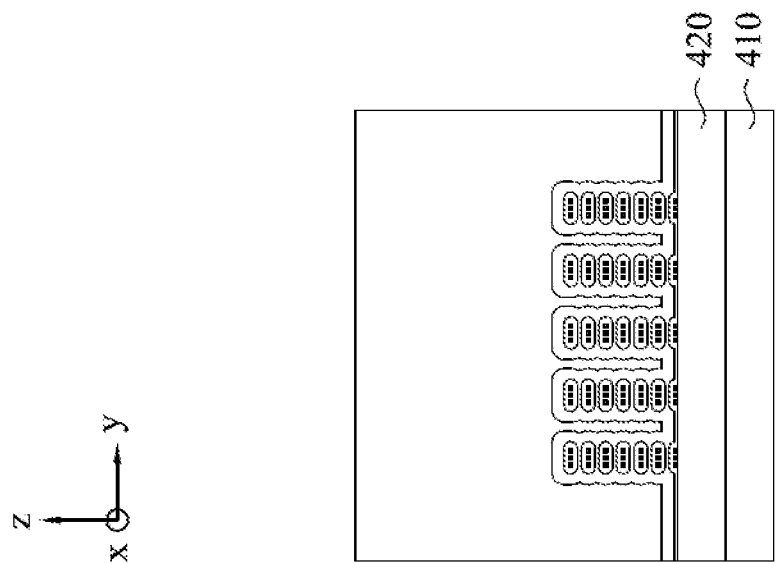
Figure 15B:
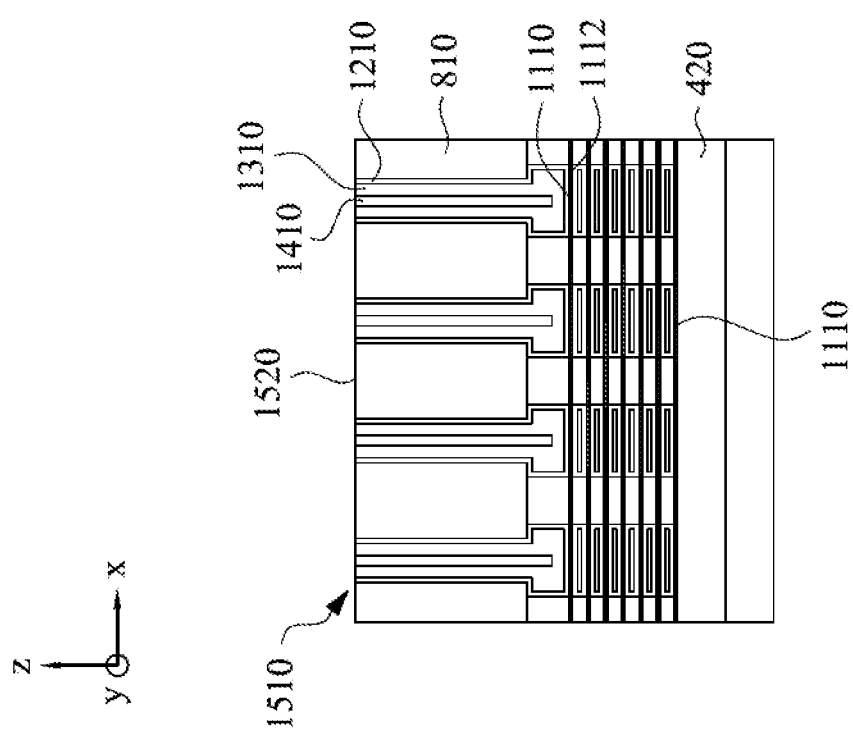
Figure 16A:
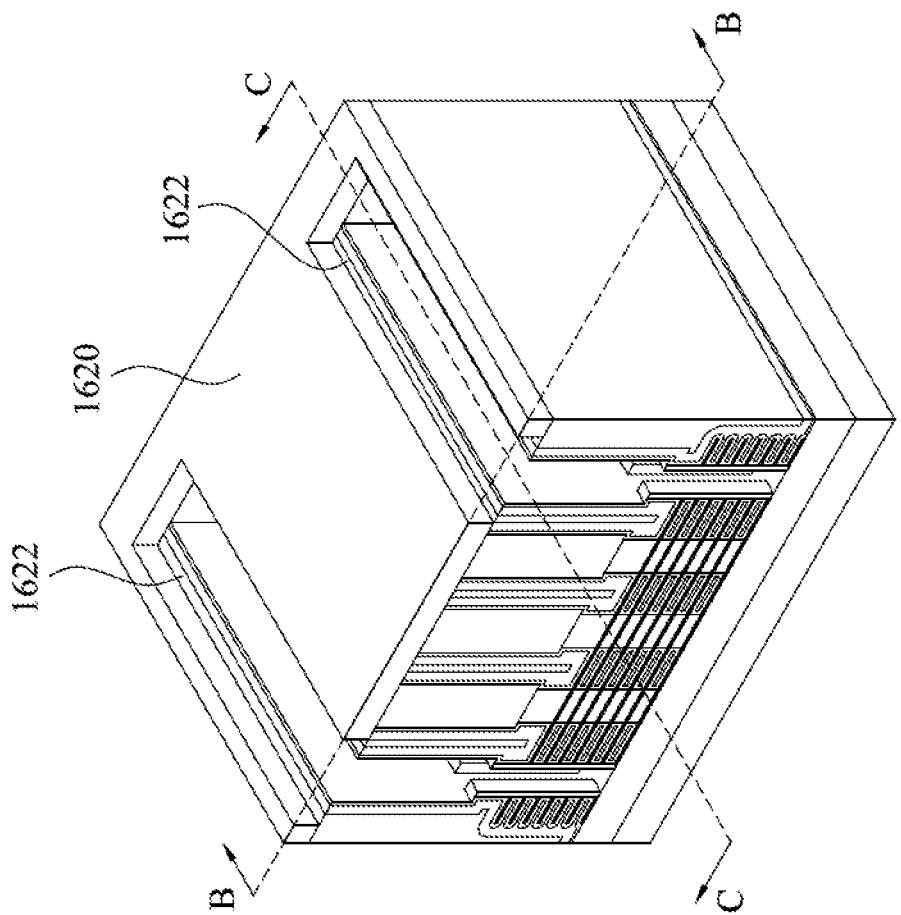
Figure 16C:
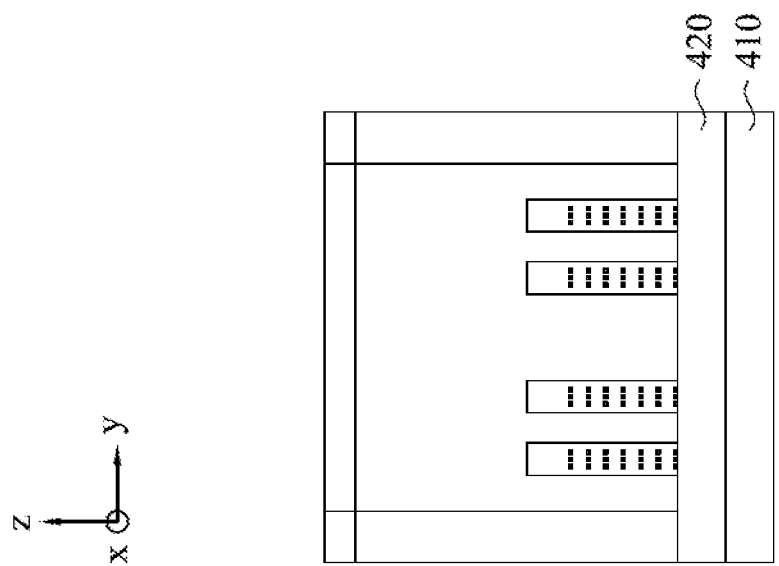
Figure 16B:
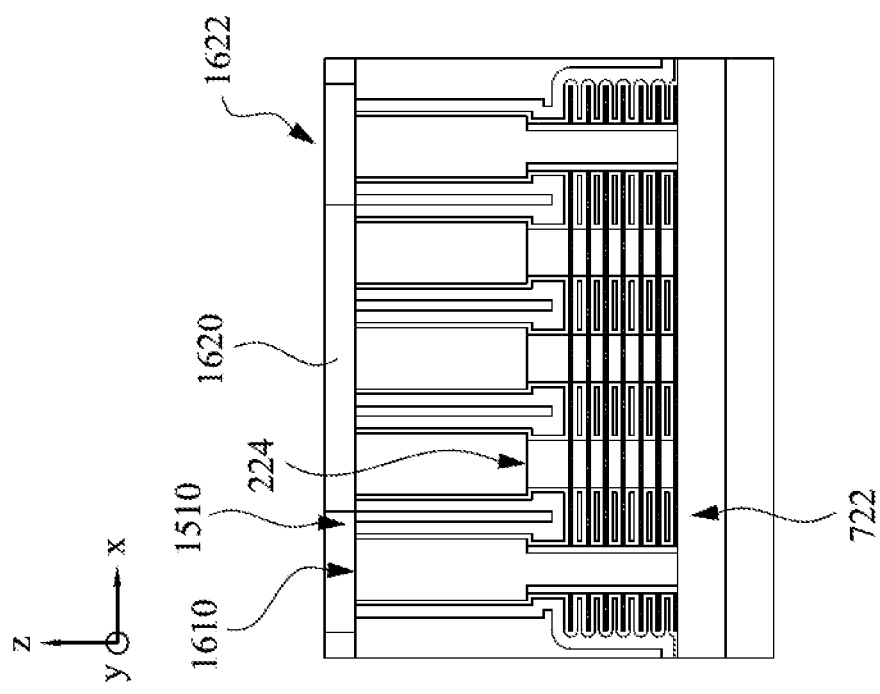
Figure 16D:
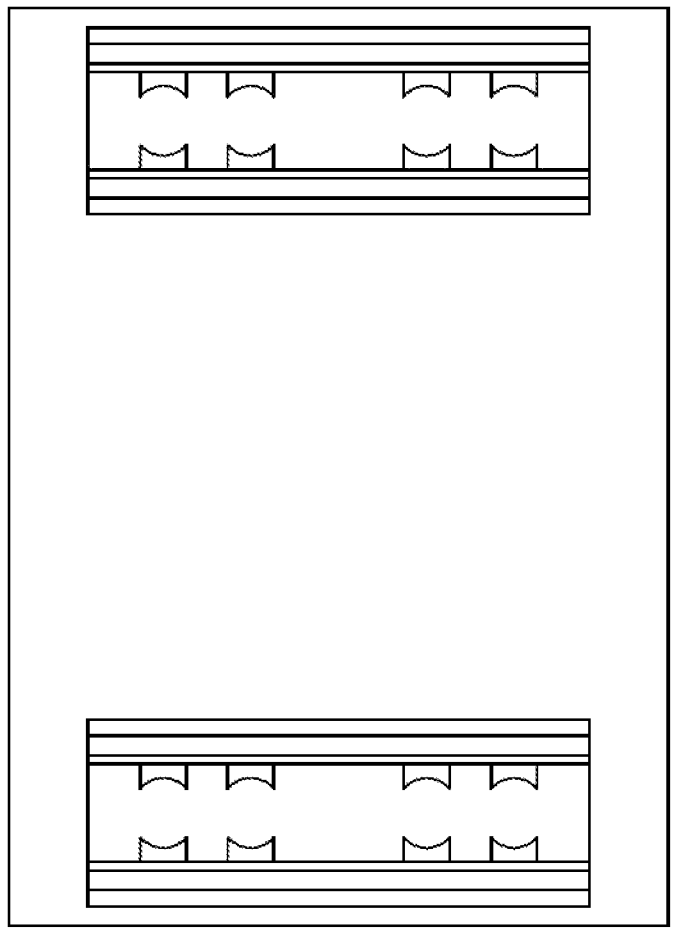

As shown in FIG. 15, the replacement gate structures 1510 are formed by removing the excess materials of the gate electrode layer 1410, the gate dielectric layer 1210, the work function adjustment layer 1310 over the upper surface 1520 of the ILD layer 810 through a planarization operation, e.g., a CMP operation, at least until the ILD layer 810 is revealed. In some embodiment, an upper portion of the ILD layer 810 may also be removed by the planarization operation.

The replacement gate structure 1510 includes the gate dielectric layer 1210, the work function adjustment layer 1310 and the gate electrode layer 1410. One or more of the gate dielectric layer 1210, the work function adjustment layer 1310 and the gate electrode layer 1410 wrap around the channel portions 1110 of the CNTs 450. The extension portions 1112 of the CNTs 450 may be doped to function as source/drain extension portions or may be maintained as intrinsic to become part of the channels 1110.

In some embodiment, the gate dielectric layer 1210 fully wraps around the channel portions 1110 of the CNTs 450. And the work function adjustment layer 1310 also fully wraps around the channel portions 1110 of the CNTs 450. In some embodiments, spaces are formed between the work function adjustment layer 1310 and the spaces are filled by the gate electrode layer 1410. The gate electrode layer 1410 may not wrap around the channel portions 1110 of the CNTs 450.

FIG. 15 shows, as an illustrative example, that the gate structure 1510 does not fully wrap up the channel portion 1110 of the lowest CNT 450 that is positioned on the insulation layer 420. This example does not limit the scope of the disclosure. In some embodiment, the channel portion 1110 of the lowest CNT 450 may be fully released by removing the upper portion of the insulation layer 420.

It is possible that some of the sacrificial gate structures 710 may not be replaced by replacement gate structures 1510 and may remain after the replacement gate structures 1510 are formed.

Figure 17:
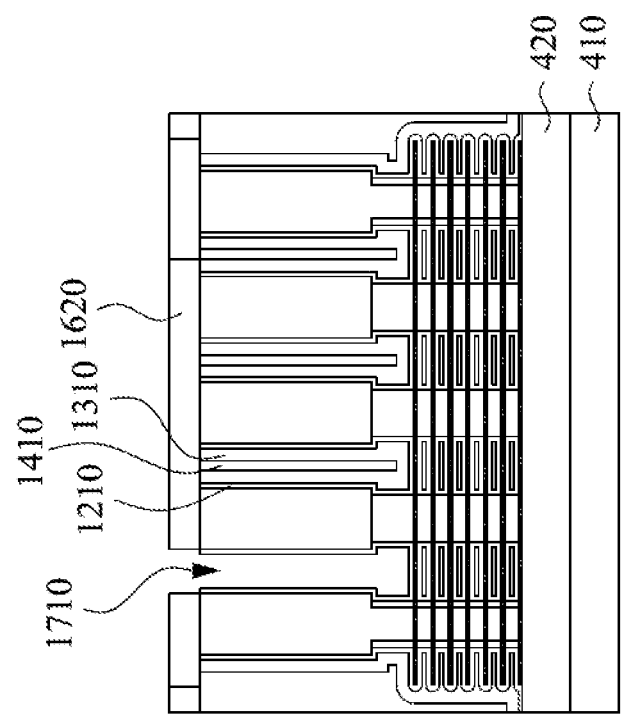
Figure 18A:
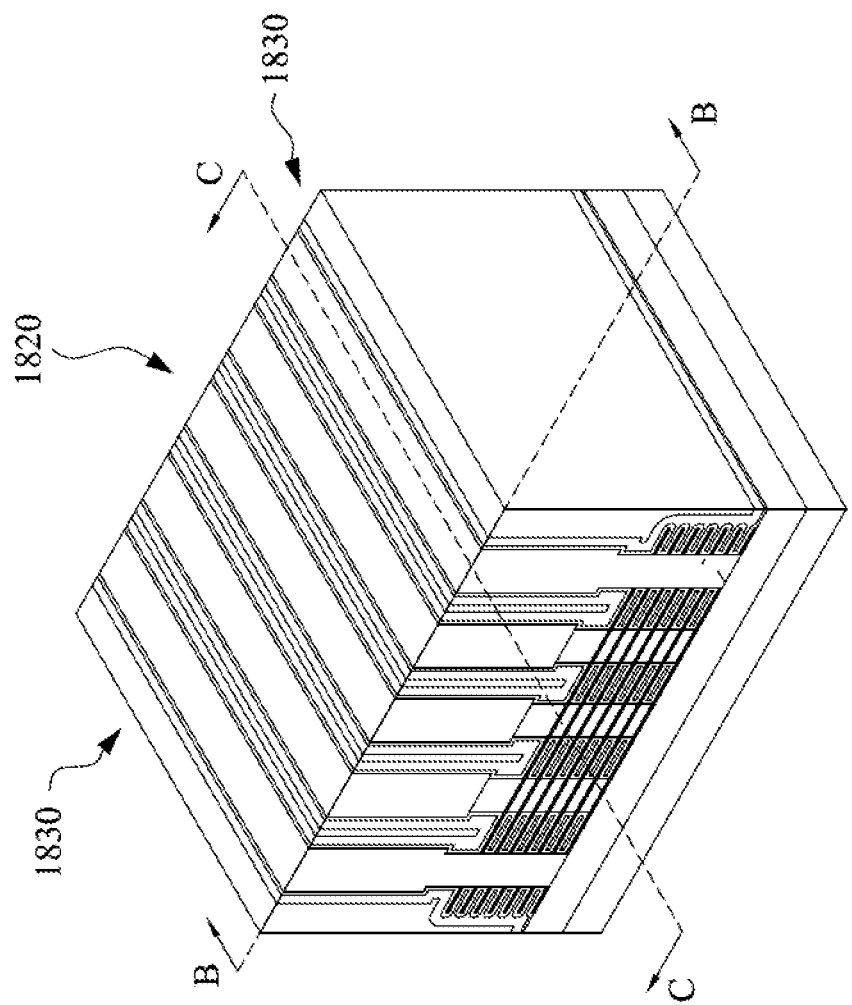
Figure 18C:
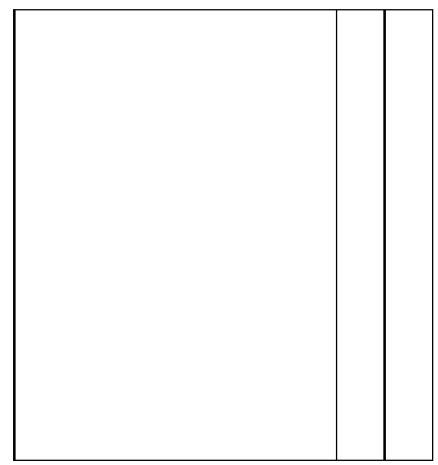
Figure 18B:
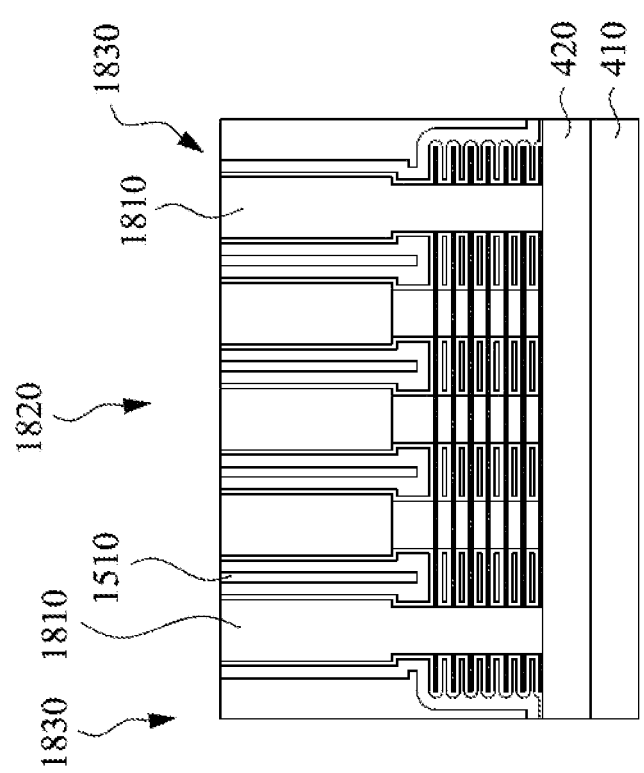

In example operation 345, with reference to FIGS. 16-18, diffusion break structures 1810 are formed between gate structures 1510 or 710. The diffusion break structure 1810 is a dielectric body that laterally separates the CNTs 450. Therefore, the diffusion break structures 1810 borders a separated active region or circuit region 1820. Charge carriers do not flow in or out of the separated active region 1810 through the CNTs 450 because the CNTs 450 are truncated by the diffusion break structure 1810.

Specifically, FIG. 16 shows an example double diffusion break embodiment. A trench 1610 is formed adjacent to a gate structure 1510 or 710. The trench 1610 is formed via etching with a mask layer 1620 formed and patterned over the wafer 400. An opening 1622 of the patterned mask layer 1620 overlaps the extension portions 724 of the CNTs 450. Selective wet etching or dry etching operations are used to remove the ILD layer 810 and the buffer layers 440 either sequentially or together, depending on the materials of the buffer layers 440 and the ILD layer 810. After the ILD layer 810 and the buffer layers 440 are removed in the trench 1610, the extension portions 724 of the CNTs 450 are truncated in the trench 1610 by etching. It should be appreciated that the extension portions 724 of the CNTs 450 may not be fully removed from the trench 1610. The etching may truncate the extension portions 724 within the trench 1610 while leaving some residual CNTs 450 remaining in the trench 1610, as illustratively shown in FIG. 16D, which is a top view of the trench 1610. As the trench 1610 is formed by terminating an extension portion 724 of the CNTs 450, the trench 1610 is more adjacent to a channel portion 722 of the CNT 450 than another extension portion 724 of the CNT 450.

FIG. 17 shows a B-plane view of an alternative embodiment where a single diffusion break 1710 is formed by removing at least partially a gate structure 1510, 710. As mentioned herein, some sacrificial gate 710 may not be replaced with the replacement gate structure 1510 and may be kept for structural integrity, e.g., as dummy gates, or for forming the single diffusion break structure 1710. FIG. 17 shows a trench 1710 that is formed by opening a replacement gate structure 1510, as an illustrative example. It should be appreciated that similar description also applies to opening a sacrificial gate structure 710 in forming the trench 1710.

As shown in FIG. 17, an opening 1720 of the mask layer 1620 overlaps a channel region 722 of the CNTs 450. Selective wet etching or dry etching operations may be performed to remove the gate electrode 1410 and the work function adjustment layer 1310, either sequentially or together, depending on the choices of materials of the gate electrode 1410 and the work function adjustment layer 1310. After the gate electrode 1410 and the work function adjustment layer 1310 are removed, the channel portions 722 of the CNTs 450 are truncated in the trench 1710 by, e.g., anisotropic etching or selective etching.

The trenches 1610, 1710 may be sufficiently deep to truncate the respective portions of the CNTs 450, while the trenches 1610, 1710 do not extend into the insulation layer 420 or the substrate 410 and may stop at a point about the upper surface of the insulation layer 420 or the substrate 410. For example, in a case that the lowest CNTs 450 are positioned over a semiconductor buffer layer 440 that is deposited directly on the substrate 410, the trenches 1610, 1710 do not extend into the substrate 410. In an embodiment, the trenches 1610, 1710 may extend into layers under the lowest CNTs 450 due to unintentional process control variations, which does not deviate from the principles of the disclosure.

Then, as shown in FIG. 18, the trench 1610, 1710 is filled with a dielectric body 1810. The dielectric body 1810 is silicon oxide, silicon nitride, a low-K dielectric material or other suitable dielectric material. FIG. 18 follows from the double diffusion break embodiment of FIG. 16 for illustrative purposes, which does not limit the scope of the disclosure. Similar descriptions also apply to a dielectric body filled within the trench 1710 of single diffusion break. The dielectric body 1810 functions as a diffusion break structure 1810 to separate the active region or circuit region 1820 from the rest portions 1830 of a same IC device. Specifically, charge carriers are blocked by the diffusion break structure 1810 from flowing between the active region 1820 and the rest portion 1830 through the CNTs 450.

As shown in FIG. 18, the diffusion break structure 1810 separates and blocks all the CNTs 450 of the active region 1820. In some other embodiments, not all the CNTs 450 in the active region 1820 are used as channel strips for charge carrier flow. For example, the channel releasing operation of FIG. 11 may only release some of the upper CNTs 450, while leaving the lower CNTs 450 remain encapsulated by the buffer layers 440. The lower CNTs 450 are thus not configured as channel strips. In that scenario, the diffusion break structure 1810 may have a depth to truncate or block only those upper CNTs 450 that are used as channel strips for the respective devices.

After the diffusion break structure 1810 are formed, the CNTs 450 are separated into a first array of CNTs 450 by one side of the diffusion break structure 180 and a second array of CNTs 450 by the opposing side of the diffusion break structure 180. The CNTs 450 of the two arrays separated by the diffusion break structure 1810 are in lateral alignment with one another because the two arrays belong to the same vertical stack of CNTs 450 before the diffusion break structure 1810 is formed.

Figure 19A:
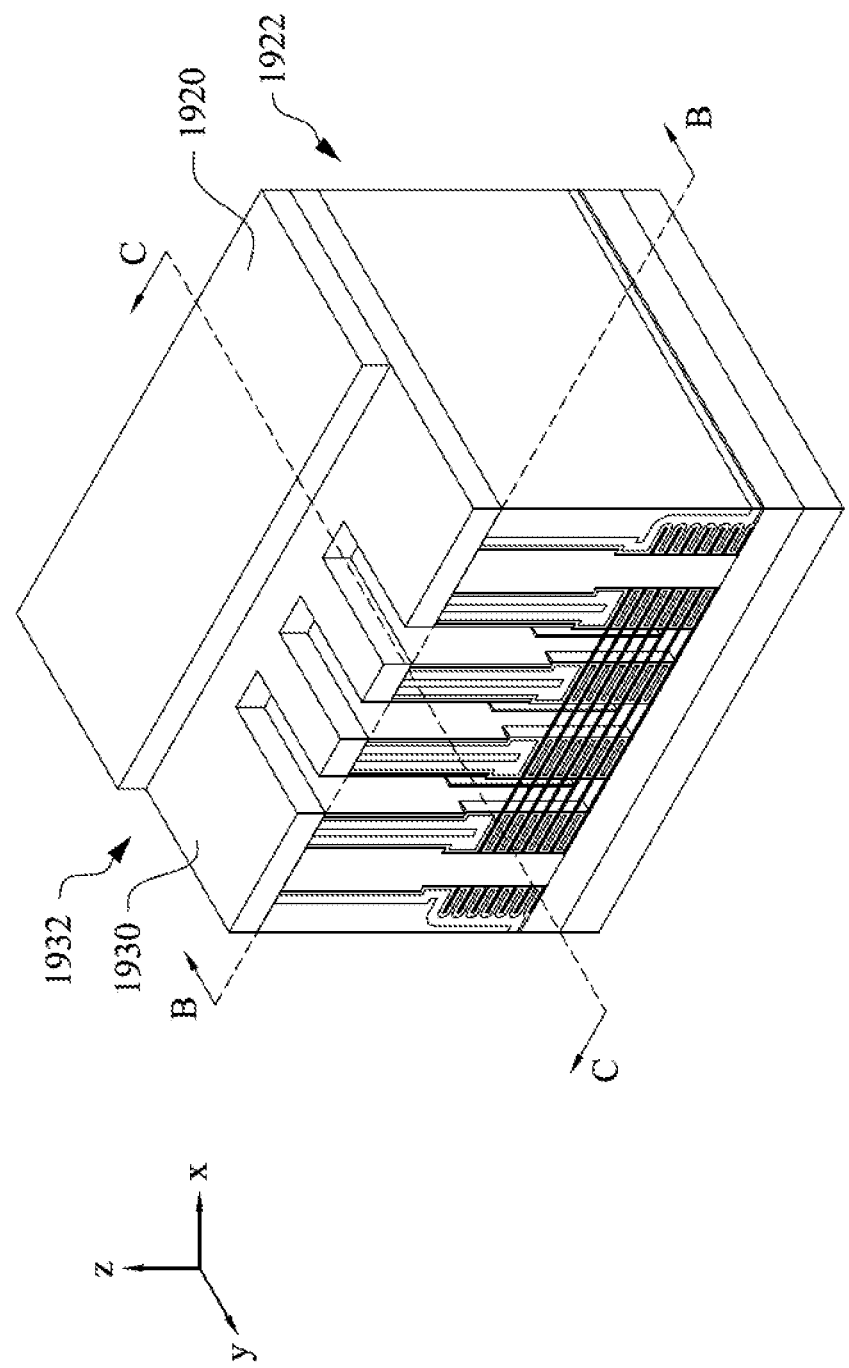
Figure 19C:
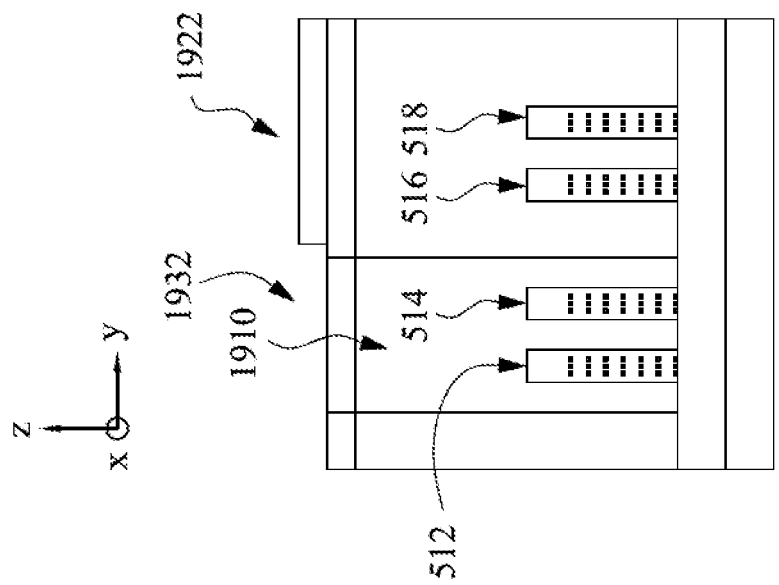
Figure 19B:
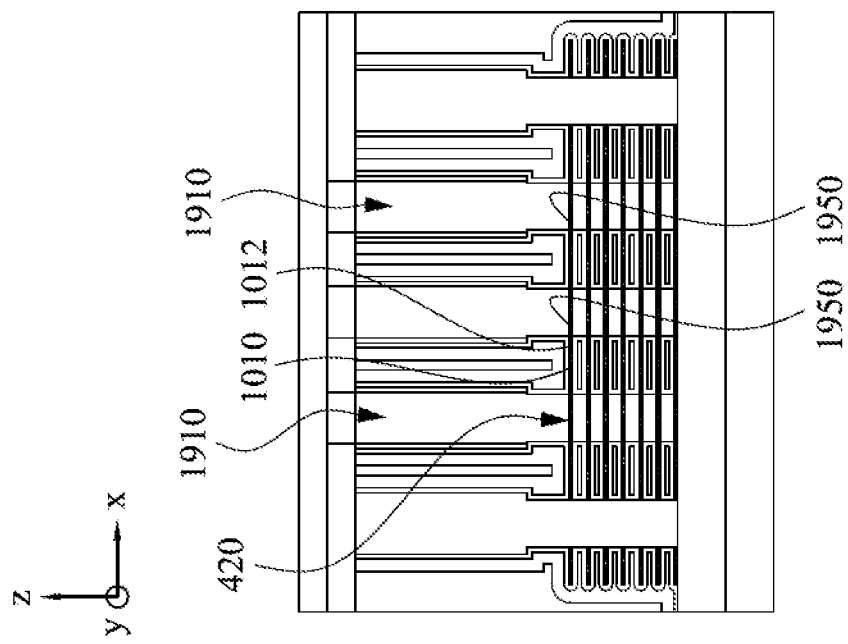

In example operation 350, with reference also to FIGS. 19-23, source/drain structures 2010, 2110, 2210 are formed in the active area 1820 adjacent to the replacement gate structures 1510. As shown in FIG. 19, the active area 1820 is configured to have an nFET area 1932 and a pFET area 1922. As an illustrative example, the nFET area 1932 includes CNTs 450 in the fin structures 512, 514. The pFET area 1922 includes CNTs 450 in the fin structures 516, 518. The extension portions 724 of the CNTs 450 are released in source/drain openings 1910 in the nFET area 1932. With a mask 1920 covering the pFET area 1922 and a photoresist layer 1930 patterned over the nFET area 1932, source/drain openings 1910 are formed by removing the ILD layer 810 and by releasing CNTs 450 in the extension portions 724 of the fin structures 510. After the buffer layers 440 in the extension portions 724 are removed, the release CNTs 450 become the source/drain portions 1950 of the CNTs 450. The source/drain portions 1950 are connected to the channel portions 1110 through source/drain extension portions 1012 of the CNTs 450. In some embodiment, the source/drain extension portions 1012 are configured as part of the channel portion 1010.

Optionally, after source/drain openings 1910 are formed, an inner spacer structure is formed within the source/drain openings 1910 and adjacent to the gate structure 1510. The inner spacer structure includes one or more layers of dielectric materials.

Figure 20A:
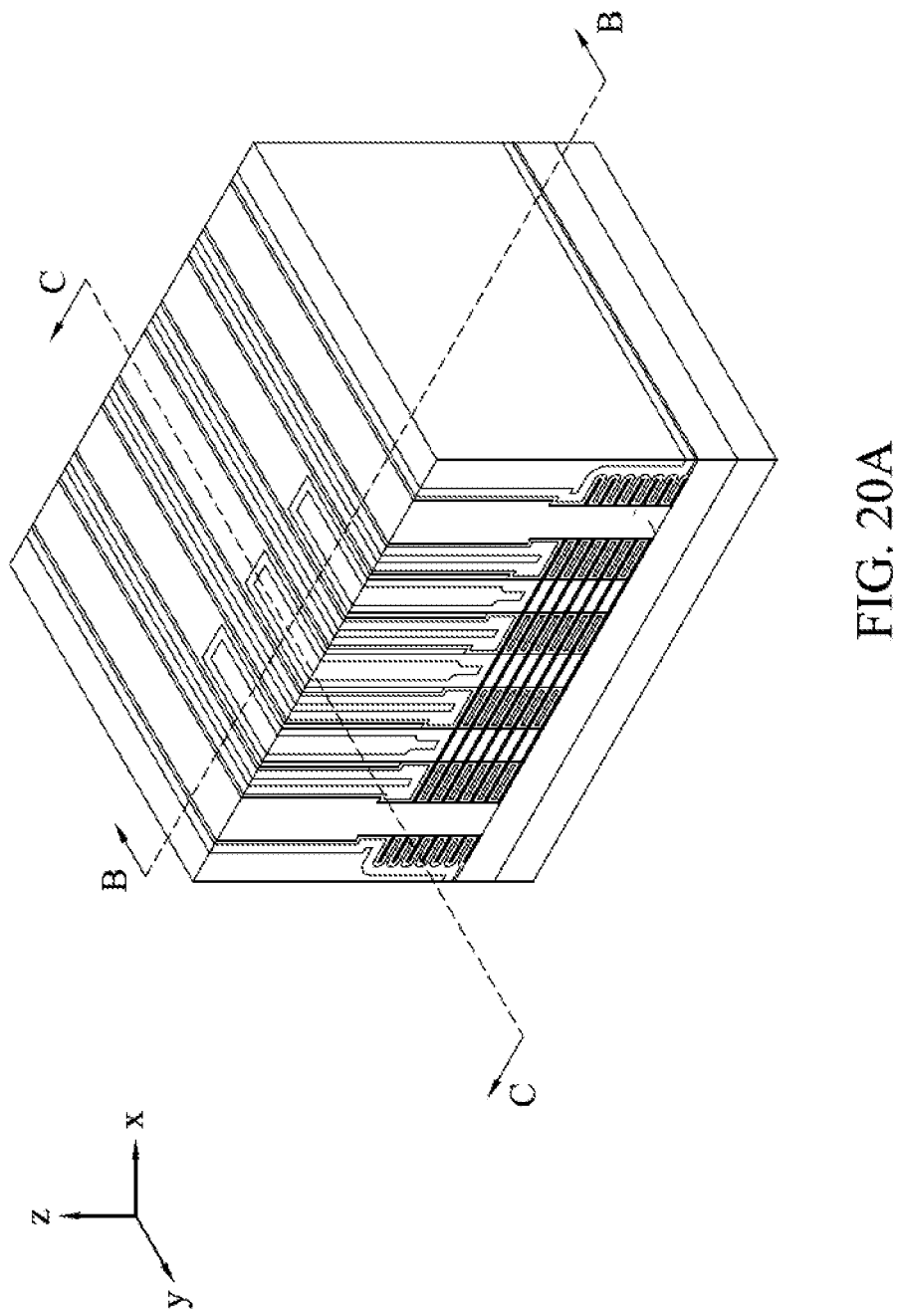
Figure 20C:
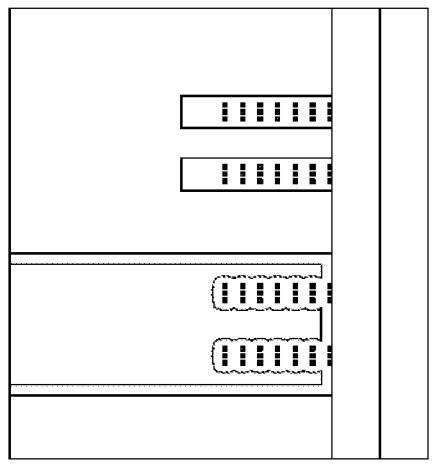
Figure 20B:
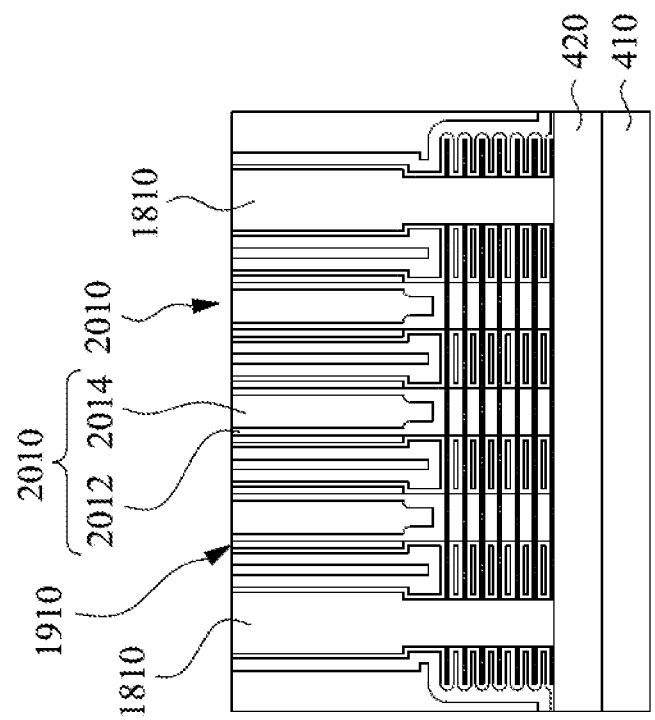

Next, as shown in FIG. 20, source/drain structures 2010 are formed within the source/drain openings 1910 by filling the source/drain openings 1910 with one or more layers of a conductive material. The conductive material includes one or more of W, Cu, Co, Ti, Ag, Al, TiAl, TiAlN, TaC, TaCN, TaSiN, Mn, Co, Pd, Ni, Re, Ir, Ru, Pt, and Zr, oSc, Er, Y, La, or any other suitable conductive materials. In some embodiments, the source/drain structure 2010 include a first layer or lower contact layer 2012 and a second layer or an upper contact layer 2014. The lower contact layer 2012 wraps around the source/drain portions 1950 of CNTs 450 and an upper contact layer 2014 is formed over the lower contact layer 2012. In some embodiments, the lower contact layer 2012 is configured as a work function adjustment layer. The lower contact layer 2012 is Pd, Pt, Ru, Ni, Mg, for pFET or Sc, Er, Y, La, Ni, Mg for nFET. The upper contact layer 2014 is one or more of W, Cu and Co in some embodiments, which are metal materials suitable to be interconnection structures under the back-end-of-line processes. The upper contact layer 2014 may be configured as a source/drain electrode. In some further embodiment, a third contact layer is formed between the CNTs 450 and the lower contact layer 2012.

In an embodiment, as shown in FIG. 20, the upper contact layer 2014 does not extend downward vertically between the source/drain portions 1950 of the CNTs 450. The disclosure is not limited by this example. In other examples, the upper contact layer 2014 may extend downward besides and/or between the source/drain portions 1950 of the CNTs 450.

In the example of FIG. 20, the source/drain structure 2010 wraps around the source/drain portions 1950 of the CNTs 450. That is, the source/drain structures 2010 contacts the CNTs 450 by the sidewall surface thereof.

Figure 21:
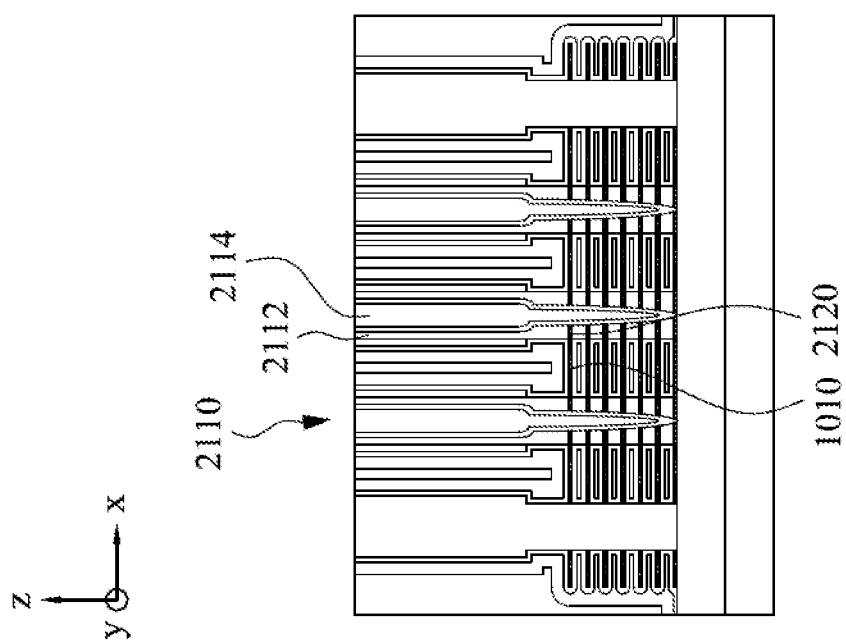
Figure 22A:
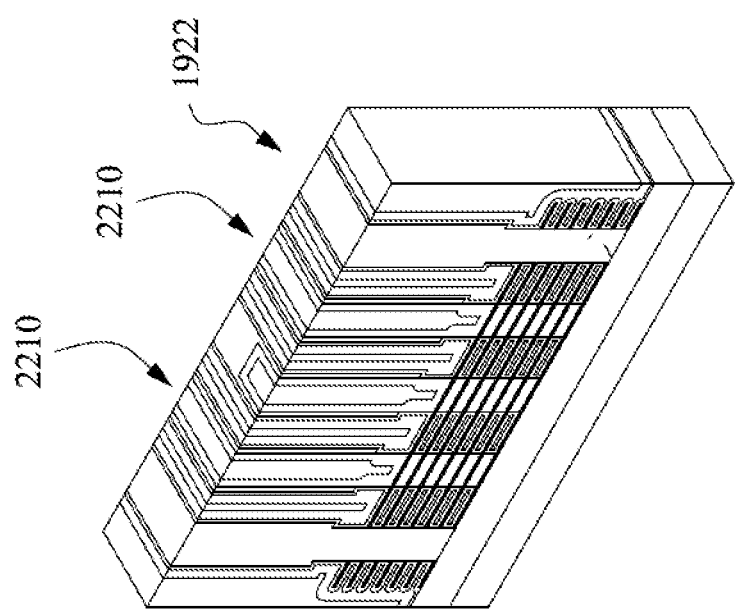
Figure 22A:
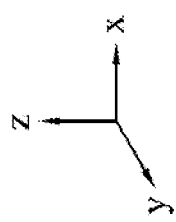
Figure 22C:
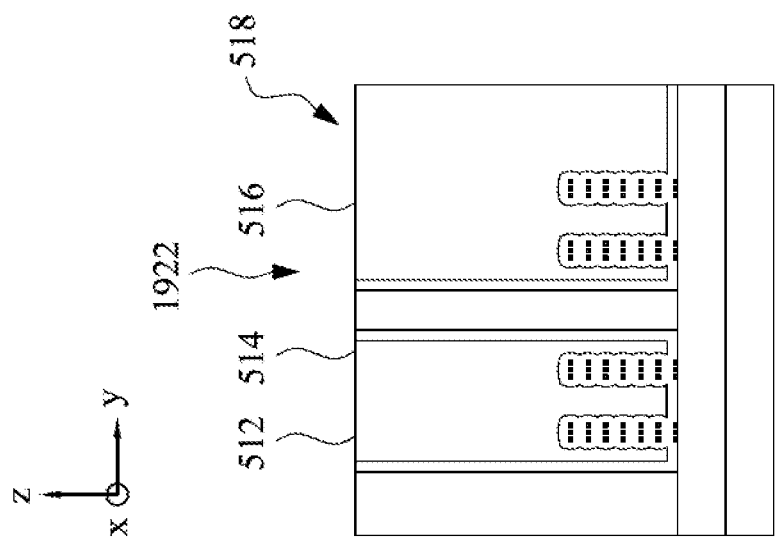
Figure 22B:
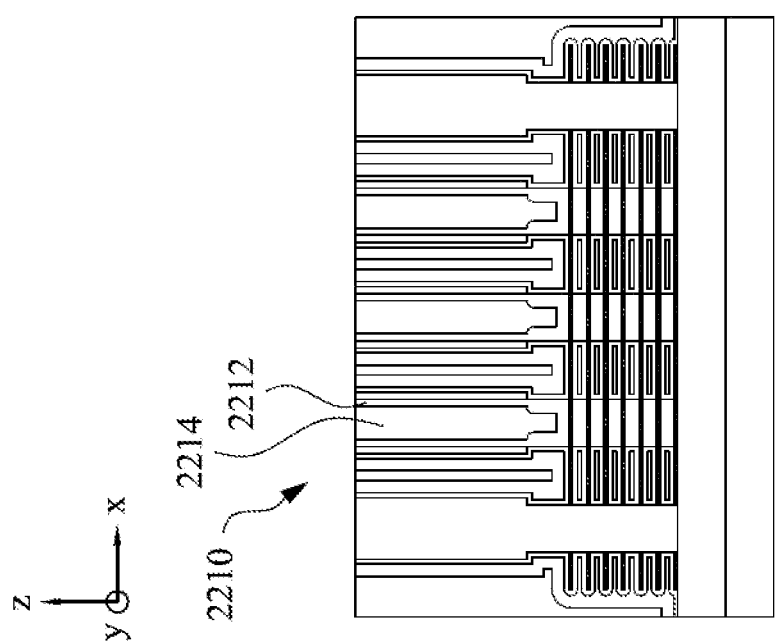

In another embodiment, as shown in FIG. 21, the source/drain portions 1950 of the CNTs 450 are at least partially receded and the source/drain structures 2110 contact edge surfaces 2120 of the receded CNTs 450. The edge surfaces 2120 may be formed as part of the remaining source/drain portions 1950 or may be part of the source/drain extension portions 1012 or the channel portions 1110 of the CNTs 450. Similar to the source/drain structure 2010, the source/drain structure 2110 may also include a lower contact layer 2112 and an upper contact layer 2114.

As shown in FIG. 22, source/drain structures 2210 are formed in the pFET area 1922. The source/drain structure 2210 for the pFET may include a different material for the lower contact layer 2212 from that of the lower contact layer 2012, 2112 for the nFET. The source/drain structure 2210 for the pFET may include a same upper contact layer 2214 as that of the upper contact layer 2014, 2112 for the nFET.

Figure 23:
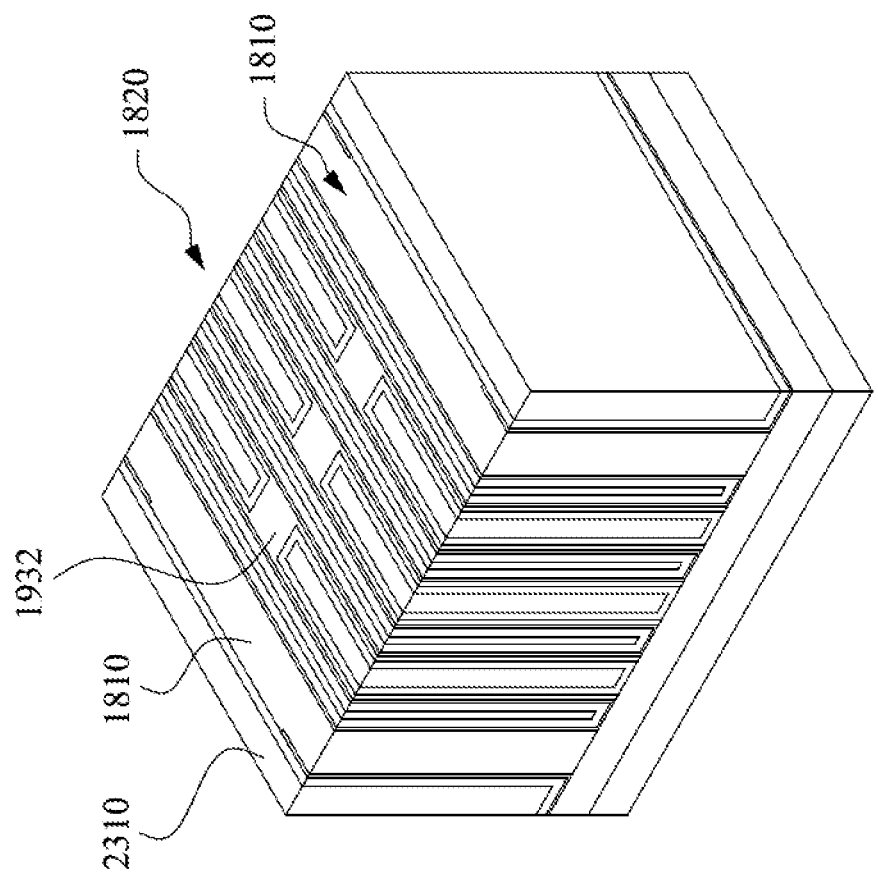

FIG. 23 shows a structure 2300 in a perspective view. Referring to FIGS. 20-23 together, the structure 2300 includes an active area or circuit area 1820 that is bordered by a diffusion break structure 1810. The active area 1820 includes an nFET area 1932 and a pFET area 1922 which both have semiconductor strips 450 configured for charge carrier flows. The diffusion break structure 1810 has a depth that is sufficient to truncate all the CNTs 450 that are configured for charge carrier flows for the nFET area 1932 or the pFET area 1922. In an embodiment, the diffusion break structure 1810 does not extend into a layer that is positioned immediately below the lowest CNT 450. In each of the nFET area 1932 or the pFET area 1922, gate structures 1510 wrap around at least some of the channel portions 1110 of the CNTs 450. The source/drain structures 2010, 2110, 2210 are positioned adjacent to the respective gate structures 1510 and contact the CNTs 450 by one or more of the sidewall surfaces or the edge surfaces of the CNTs 450.

In the example of FIG. 23, an nFET device in the nFET area 1932 and a pFET device in the pFET area 1922 are arranged laterally with respect to one another. The disclosure is not limited to this example. In some other embodiment, the nFET and the pFET are arranged vertically with respect to one another, e.g., in complementary FET devices. Specifically, a first set of semiconductor strips of the nFET and a second set of semiconductor strips of the pFET may be stacked vertically with respect to one another. The first set of semiconductor strips and the second set of semiconductor strips may be adjacent to a common gate structure. The diffusion break structure 1810 may be configured to truncate the first set of semiconductor strips, the second set of semiconductor strip or both the first set and the second set of semiconductor strips.

The description herein uses CNT as illustrative example of semiconductor strips, which does not limit the scope of the disclosure. Similar descriptions also apply to semiconductor strips of other materials or structural configurations. For example, the semiconductor strips may be nanowire or nanosheet strips of silicon, silicon germanium or gallium nitride.

The advantages and features of the disclosure are further appreciable through the following example embodiments:

In an embodiment, a method forms a gate-all-around field effect transistor. A vertical stack of layers are formed. The vertical stack of layers includes semiconductor strips and buffer layers stacked in an alternating manner over a substrate. A first sacrificial gate structure is formed over the vertical stack of layers. A dielectric layer is formed over the first sacrificial gate structure and the vertical stack of layers. A first channel portion of the vertical stack of layers is exposed by removing the first sacrificial gate structure. A first subset of the semiconductor strips are released in the first channel portion by removing at least part of the buffer layers from the first channel portion. A first replacement gate structure is formed adjacent to the released first subset of the semiconductor strips. A dielectric body is formed adjacent to the first replacement gate structure. The dielectric body truncates each of the first subset of the semiconductor strips. A source/drain structure is formed adjacent to the first replacement gate structure.

In another embodiment, a structure includes a substrate, a first vertical array of semiconductor strips that are separated from one another and over the substrate, a first gate structure adjacent to each of the first vertical array of semiconductor strips, a second vertical array of semiconductor strips that are separated from one another and over the substrate, a second gate structure adjacent to each of the second vertical array of semiconductor strips, and a dielectric body over the substrate and laterally between the first vertical array of semiconductor strips and the second vertical array of semiconductor strips.

In a further embodiment, a semiconductor structure includes a substrate, a first vertical array of semiconductor strips that are separated from one another, a first gate structure adjacent to each of the first vertical array of semiconductor strips, and a first source/drain structure adjacent to the first gate structure and contacting the first vertical array of semiconductor strips. The semiconductor structure also includes a second vertical array of semiconductor strips that are separated from one another, a second gate structure adjacent to each of the second vertical array of semiconductor strips, and a second source/drain structure adjacent to the second gate structure and contacting the second vertical array of semiconductor strips. The semiconductor structure also includes a dielectric body over the substrate and laterally between the first source/drain structure and the second source/drain structure. The dielectric body is more adjacent to the first source/drain structure than to any gate structure in the semiconductor structure.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a vertical stack of layers including semiconductor strips and buffer layers stacked in an alternating manner over a substrate;
   forming a first sacrificial gate structure over the vertical stack of layers;
   exposing a first channel portion of the vertical stack of layers by removing the first sacrificial gate structure;
   releasing a first subset of the semiconductor strips in the first channel portion by removing at least part of the buffer layers from the first channel portion;
   forming a first replacement gate structure adjacent to the released first subset of the semiconductor strips; and
   forming a dielectric body adjacent to the first replacement gate structure, the dielectric body truncating each of the first subset of the semiconductor strips, the forming the dielectric body including:
   exposing the first subset of semiconductor strips between the first replacement gate structure and a second gate structure; and
   removing portions of the first subset of semiconductor strips exposed between the first replacement gate and the second gate structure via etching.

2. The method of claim 1, wherein the dielectric body extends downward and ends at a point higher than an upper surface of the substrate.

3. The method of claim 1, further comprising:
   forming an insulation layer between the substrate and the vertical stack of layers including the semiconductor strips and the buffer layers.

4. The method of claim 1, wherein the substrate is a semiconductor material and the vertical stack of layers includes a buffer layer at a bottom of the vertical stack of layers and in contact with the substrate.

5. The method of claim 1, wherein the buffer layers include a polycrystalline or amorphous material of one of Si, Ge or SiGe.

6. The method of claim 1, wherein the buffer layers include a dielectric material.

7. The method of claim 1, further including removing a gate dielectric layer of the second gate structure before the removing the portions of the first subset of semiconductor strips exposed under the second gate structure.

8. The method of claim 1, wherein the removing the gate electrode layer in the second gate structure includes removing a gate electrode layer of a replacement gate structure.

9. The method of claim 1, wherein the removing the gate electrode layer in the second gate structure includes removing a gate electrode layer of a sacrificial gate structure.

10. The method of claim 1, wherein the dielectric body separates all the semiconductor strips of the vertical stack of layers and extends to an upper surface of the substrate.

11. A method comprising:
    forming a vertical stack of layers including semiconductor strips and buffer layers stacked in an alternating manner over a substrate;
    exposing a first channel portion of the vertical stack of layers;
    releasing a first subset of the semiconductor strips in the first channel portion by removing at least part of the buffer layers from the first channel portion;
    forming a first replacement gate structure wrapping around the released first subset of the semiconductor strips;

forming a dielectric body adjacent to the first replacement gate structure, the dielectric body truncating each of the first subset of the semiconductor strips, the forming the dielectric body including:
exposing the first subset of semiconductor strips between the first replacement gate structure and a second gate structure; and
removing portions of the first subset of semiconductor strips exposed between the first replacement gate and the second gate structure via etching.

12. The method of claim 11, wherein the gate structure is a sacrificial gate structure.

13. The method of claim 11, wherein the gate structure is a replacement gate structure.

14. The method of claim 11, further comprising:
forming a source/drain structure that wraps around and contacts a longitudinal sidewall of one or more of the semiconductor strips under the first gate structure.

15. The method of claim 11, further comprising:
forming a source/drain structure that laterally contacts an edge surface of one or more of the semiconductor strips of the vertical stack.

16. A method, comprising:
forming a third vertical array of semiconductor strips between a first vertical array of semiconductor strips and a second vertical array of semiconductor strips;
forming a first conductive gate structure wrapping around the first vertical array of semiconductor strips;
forming a second conductive gate structure wrapping around the second vertical array of semiconductor strips; and
forming a dielectric body by:
removing an interlayer dielectric layer between the first and second conductive gate structures;
removing the third vertical array of semiconductor strips; and
replacing the interlayer dielectric layer with a dielectric layer.

17. The method of claim 16, wherein the dielectric body laterally contacts edge surfaces of the first vertical array of semiconductor strips and laterally contacts edges surfaces of the second vertical array of semiconductor strips.

18. The method of claim 16, wherein the forming the dielectric body includes:
forming a mask layer having an opening overlapping channel portions of the third vertical array of semiconductor strips;
forming a trench by etching the interlayer dielectric layer and the channel portions through the opening to expose an upper surface of a substrate underlying the third vertical array; and
filling the trench with a dielectric layer.

19. The method of claim 18, wherein the etching the channel portions includes truncating carbon nanotubes of the channel portions.

20. The method of claim 19, wherein residual carbon nanotubes remain in the trench following the etching the channel portions.

* * * * *